US012052025B2

(12) United States Patent
Mallinson

(10) Patent No.: US 12,052,025 B2
(45) Date of Patent: Jul. 30, 2024

(54) ANALOG SIGNAL TIME GAIN AMPLIFIER

(71) Applicant: SiliconIntervention Inc., Kelowna (CA)

(72) Inventor: A. Martin Mallinson, Kelowna (CA)

(73) Assignee: SiliconIntervention Inc., Kelowna (CA)

(*) Notice: Subject to any disclaimer, the term of this patent is extended or adjusted under 35 U.S.C. 154(b) by 133 days.

(21) Appl. No.: 18/077,949

(22) Filed: Dec. 8, 2022

(65) Prior Publication Data
US 2023/0179210 A1 Jun. 8, 2023

Related U.S. Application Data

(60) Provisional application No. 63/287,470, filed on Dec. 8, 2021.

(51) Int. Cl.
*H03M 1/00* (2006.01)
*G06F 5/01* (2006.01)
(Continued)

(52) U.S. Cl.
CPC ............. *H03M 1/002* (2013.01); *G06F 5/01* (2013.01); *G06F 7/02* (2013.01); *H03F 3/04* (2013.01);
(Continued)

(58) Field of Classification Search
CPC ............ H03M 1/02; H03M 1/34; H03M 1/44; H03M 3/02; H03M 1/002; H03M 1/0626; H03M 1/0648; H03M 1/0668; H03M 1/0682; H03M 1/1245; H03M 1/125; H03M 1/164; H03M 1/365; H03M 1/38; H03M 1/40; H03M 1/445; H03M 1/68; H03F 3/45475; H03F 2200/03; H03F 2203/45528; H03F 3/187; H03F 1/00; H03F 1/02; H03F 1/0205; H03F 1/0227; H03F 1/32; H03F 1/34; H03F 1/42; H03F 2200/09
(Continued)

(56) References Cited

U.S. PATENT DOCUMENTS

| 4,072,940 A | * | 2/1978 | Simon | ................... H03M 1/665 318/661 |
| 6,034,566 A | * | 3/2000 | Ohe | ........................ H03F 3/195 330/69 |

(Continued)

*Primary Examiner* — Linh V Nguyen
(74) *Attorney, Agent, or Firm* — Gard & Kaslow LLP

(57) ABSTRACT

An apparatus and method for processing signals in the analog domain. A signal is derived from analog circuit properties that is shift and scale invariant. Although the circuit properties are not quantized as in traditional digital signal processing, the signal is immune from effects of the properties, such as common mode noise, absolute voltage or current level, finite settling time, etc., as a digital signal would be. The shift and scale invariance allows for mathematical operations of addition, subtraction, multiplication and division of signals. By combining these operations, various circuits may be constructed, including a voltage controlled amplifier, a time gain amplifier, and an analog-to-digital converter. The circuits are constructed using almost no non-linear, active devices, and will thus use less power for a given speed than comparable digital devices, and will often be faster as there are no delay elements and no need to wait for the circuit properties to settle.

14 Claims, 21 Drawing Sheets

(51) Int. Cl.
  *G06F 7/02* (2006.01)
  *H03F 3/04* (2006.01)
  *H03F 3/183* (2006.01)
  *H03F 3/45* (2006.01)
  *H03G 3/00* (2006.01)
  *H03K 5/24* (2006.01)
  *H03M 1/34* (2006.01)
  *H03M 1/36* (2006.01)
  *H03M 1/06* (2006.01)

(52) U.S. Cl.
  CPC ......... *H03F 3/183* (2013.01); *H03F 3/45089* (2013.01); *H03F 3/45475* (2013.01); *H03G 3/001* (2013.01); *H03K 5/24* (2013.01); *H03M 1/34* (2013.01); *H03M 1/365* (2013.01); *H03F 2203/45528* (2013.01); *H03M 1/0682* (2013.01)

(58) Field of Classification Search
  USPC .................................. 341/138–14, 154, 153
  See application file for complete search history.

(56) References Cited

U.S. PATENT DOCUMENTS

| | | | |
|---|---|---|---|
| 9,323,959 B2* | 4/2016 | Mallinson | G06G 7/625 |
| 9,595,931 B2* | 3/2017 | Mallinson | H03F 1/0205 |
| 9,647,640 B2* | 5/2017 | Mallinson | H03H 15/02 |
| 9,793,867 B2* | 10/2017 | Frith | H03F 1/0227 |
| 10,063,251 B2* | 8/2018 | Hsiao | H03F 3/304 |
| 10,433,046 B2* | 10/2019 | Mallinson | H03F 3/45475 |
| 10,798,479 B2* | 10/2020 | Mallinson | H04R 1/1083 |
| 11,593,629 B2* | 2/2023 | Mallinson | G06N 3/065 |

* cited by examiner

ANALOG SIGNAL TIME GAIN AMPLIFIER

This application claims priority from Provisional Application No. 63/287,470, filed Dec. 8, 2021, which is incorporated by reference herein in its entirety.

FIELD OF THE INVENTION

The present invention relates generally to signal processing circuits, and more specifically to analog processing circuits.

BACKGROUND OF THE INVENTION

Analog circuits process signals as voltages, currents, charge, pulse density, time or other parameters. All of these parameters are analog properties that are continuously variable. In an analog signal processing circuit, one of these analog properties is chosen to represent the signal, and useful operations are performed as accurately as possible on those signals. The property is typically not differentiated from the signal, but rather the property is the same as the signal; for example, in an audio signal, the voltage on a wire is the same as the audio signal.

By contrast, digital circuits process signals as numbers, using two conceptual steps. First, a digital circuit assumes the existence of a digital bit, which is a quantization of an analog property (such as voltage, current, charge, etc.) into one mathematical bit of information. The digital circuit need only determine whether the analog property is "high" or "low." Second, the digital signal is expressed over a multiple number of bits to construct numbers over various ranges from the first 8 bit processors of many years ago to the 128 bit processors of today. The digital paradigm first quantizes the analog property and then abstracts it with an implicitly agreed formulation over multiple quantized analog properties, such as the meaning of digital strings of bits or "words."

If the circuit can accurately determine whether the analog property is high or low, then it can process digital data. Useful operations can be performed on the digital signal that do not depend upon the detailed operation of, or are affected by the imperfections of, the underlying circuit property. Noise, power supply variation, temperature, etc., does not affect the interpretation of the signal, which is an abstraction layer "above" the property of the circuit from which it is derived. The biggest remaining issue in a digital circuit is often how rapidly it can transition between the high and the low state and vice versa.

Digital signal processing is a powerful technique partly because it works in the abstract; thus, it does not matter how "high" or how "low" the analog property is exactly, only that it is greater or less than a certain level. The digital numbers are thus an abstraction "above" the level of the electronics. How these digital numbers interact to make adders, multipliers, shift registers and so forth are where the power of digital signal processing excels. The digital numbers are quantized. In other words, the analog property, which is not precise but rather is only above or below a certain value, is quantized to a single bit, and pluralities of these bits are interpreted as numbers to be processed.

In some instances, however, the processing of analog signals has advantages over digital signal processing. Thus, it is desirable to be able to perform analog signal processing with a similar level of abstraction to that of digital circuits.

SUMMARY OF THE INVENTION

Described herein is an apparatus and method for amplifying a signal using a time gain amplifier.

One embodiment discloses a time-gain amplifier, comprising: a first network of linear two-port elements configured to receive an input voltage Q and a reference voltage, generate a first plurality of voltages derived from the input voltage Q and the reference voltage, and combine the first plurality of generated voltages to create a first shift and scale invariant signal encoding the input voltage Q; a second network of linear two-port elements configured to receive the reference voltage, generate a second plurality of voltages derived from the reference voltage, and combine the second plurality of generated voltages to create a second shift and scale invariant signal encoding a value of 2; a third network of linear two-port elements configured to receive an input voltage Q2 and the reference voltage, generate a third plurality of voltages derived from the input voltage Q2 and the reference voltage, and combine the third plurality of generated voltages to create a third shift and scale invariant signal encoding the input voltage Q2; a fourth network of linear two-port elements configured to receive the reference voltage, generate a fourth plurality of voltages derived from the reference voltage, and combine the fourth plurality of generated voltages to create a fourth shift and scale invariant signal encoding a value of 2; a control circuit configured to provide the input voltage Q2, comprising: a switch having two ends, a first end connected to a voltage source and a second end connected to the third network, and having two positions, a closed position in which the voltage source is connected to the third network, and an open position in which the voltage source is not connected to the third network; a capacitor having a first end connected to the second end of the switch and a second end connected to a ground; and a resistor having a first end connected to the second end of the switch and a second end connected to the ground; whereby the capacitor charges when the switch is in the closed position, and discharges when the switch is in the open position at a rate determined by a resistance of the resistor and a capacitance of the capacitor, thereby providing a voltage to the third network that diminishes with time; wherein the first and second networks are connected such that the first and second shift and scale invariant signals are combined to generate a fifth shift and scale invariant signal encoding a value of (2+Q)/2; wherein the third and fourth networks are connected such that the third and fourth shift and scale invariant signals are combined to generate a sixth shift and scale invariant signal encoding a value of (2−Q2)/2; and wherein the fifth and sixth shift and scale invariant signals are combined to generate a shift and scale invariant output signal encoding an amplified value of Q/Q2, whereby the amplifier applies a gain to the input voltage Q of 1/Q2.

Another embodiment discloses a method of amplifying a signal using a time gain amplifier, comprising: discharging a charged capacitor through a resistor thereby generating an input voltage Q2 from the capacitor that diminishes with time at a rate determined by a resistance of the resistor and a capacitance of the capacitor; receiving an input voltage Q and a reference voltage in a first network of linear two-port elements; generating by the first network a first plurality of voltages derived from the input voltage Q and the reference voltage; combining the first plurality of generated voltages to create a first shift and scale invariant signal encoding the input voltage Q; receiving the reference voltage in a second network of linear two-port elements; generating by the second network a second plurality of voltages derived from the reference voltage; combining the second plurality of generated voltages to create a second shift and scale invariant signal encoding a value of 2; receiving the input voltage Q2 and the reference voltage in a third network of linear two-port elements; generating by the third network a third plurality of voltages derived from the input voltage Q2 and the reference voltage; combining the third plurality of generated voltages to create a third shift and scale invariant signal encoding the input voltage Q2; receiving the reference voltage in a fourth network of linear two-port elements; generating by the fourth network a fourth plurality of voltages derived from the reference voltage; combining the fourth plurality of generated voltages to create a fourth shift and scale invariant signal encoding a value of 2; combining the first and second shift and scale invariant signals to generate a fifth shift and scale invariant signal encoding a value of (2+Q)/2; combining the third and fourth shift and scale invariant signals to generate a sixth shift and scale invariant signal encoding a value of (2−Q2)/2; and combining the fifth and sixth shift and scale invariant signals to generate a shift and scale invariant output signal encoding an amplified value of Q/Q2, whereby the amplifier applies a gain to the input voltage Q of 1/Q2.

DETAILED DESCRIPTION OF THE INVENTION

Figure 1:
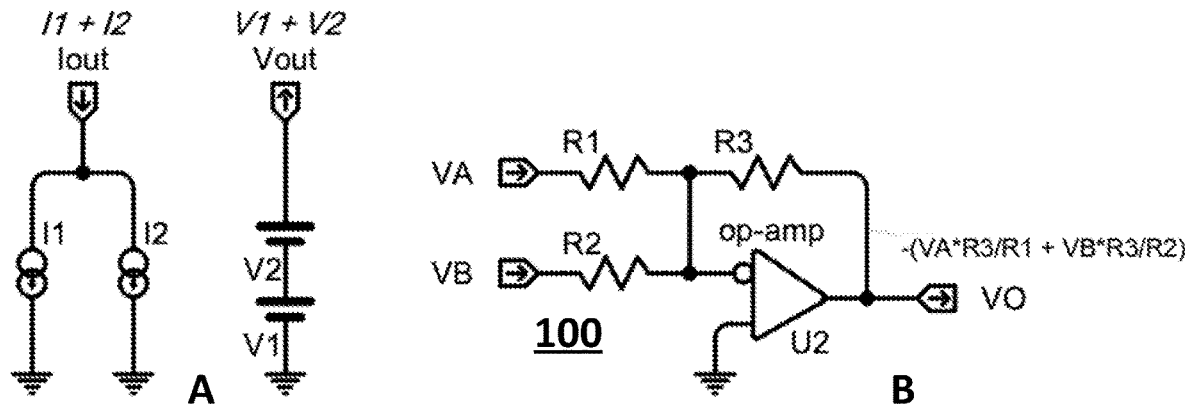
FIG. 1 is a diagram of circuits that add electronic properties and perform a form of multiplication as are known in the prior art.

Described herein is an apparatus and method for processing signals in the analog domain, without quantizing them as is done in conventional digital signal processing.

The present approach seeks to improve upon typical analog signal processing by abstracting analog signals "above" the level of the analog properties of a circuit, in a way similar to that of the digital signal paradigm but without quantizing the analog property. Such an abstraction is helpful for the same reason the digital abstraction is helpful, i.e., it removes any effect of the properties, such as common mode noise, absolute voltage or current level, finite settling time, etc., on the signal.

Processing analog signals as in the present approach also provides certain advantages over digital signal processing, particularly in power consumption. In the present approach, a signal may be processed faster than the settling time of the analog property on which it is based, thus operating with greater speed than an amplifier or analog-to-digital converter (ADC) for a given power consumption, or, alternatively, reducing the power needed for a given speed. Further, since the present approach greatly decreases the number of active devices needed, the power needed for such devices is similarly decreased.

The present approach determines a signal that is shift and scale invariant from signal properties, such as voltages, currents, charge, pulse density, time or other parameters. This signal may be manipulated mathematically by addition (and its inverse, subtraction) and division (and its inverse, multiplication). By applying these mathematical operations in certain ways, it is possible to construct various circuits in the analog domain that improve upon traditional implementations. Such circuits include a voltage controlled amplifier, a time-gain amplifier, and an analog-to-digital converter (ADC).

The signal formulation used herein is the encoding of a real number on four analog properties derived from an analog property that is input to the circuit in a way that the signal so encoded is both shift and scale invariant with respect to the properties. (It will be apparent that eight properties can similarly encode a complex number in the same way as the real numbers described herein, since a complex number is the sum of two real numbers, one multiplied by i, the square root of −1.)

Consider a signal S represented by a formulation of four analog properties A, B, C, and D. It is assumed herein that these are the voltage properties of four wires, with A the voltage on a first wire a, B the voltage on a second wire b, etc. However, as above, other analog properties may be used. The signal S is defined as:

$$S = \frac{A - B + C - D}{A - B - C + D} \quad \text{Equation 1}$$

It may be seen that this may also be expressed as a function of two differential signals P1 and P2, as S=(P1−P2)/(P1+P2), or the inverse.

This formulation is both shift and scale invariant. Shift invariance means that adding some factor X to each property does not change the signal; it will be apparent from Equation 1 that if A becomes A+X, B becomes B+X, etc., the signal S will not change since all of the X terms will cancel out in both the numerator and denominator.

Scale invariance means that multiplying each property by some factor Y will also not change the signal. Again, it is apparent from Equation 1 that if each property is multiplied by the same factor Y, both the numerator and denominator will be multiplied by Y, again canceling out and having no effect on the signal S.

An important effect of scale invariance is that a scale invariant signal becomes independent of the settling time of the circuit. Consider a single pole filter response Y to a step of amplitude A:

$$Y(t) = A \cdot (1 - e^{-t/\tau})$$

which is an asymptotic approach over time to the step size A such that, after one time constant τ, the value of Y will be 0.632 times A. If all of the analog properties are subject to the same settling time and they are sampled by a succeeding stage after the same delay, each is in error by the same multiplicative factor. The same argument applies for any time elapsed; one time constant is only one example. Since the formulation of the signal from the properties can tolerate any linear operation, the signal, which again is distinct from the properties, does not experience the delay, and the circuit property need not settle in order to determine the signal.

Deriving a signal in this way from multiple analog properties allows addition (and thus subtraction by the inverse) and division (and hence multiplication by the inverse) of signals derived from transducers and similar devices. Consider how such operations are achieved in the known art.

FIG. 1 is a diagram of circuits that add electronic properties and perform a form of multiplication as are known in the prior art. Part A of FIG. 1 shows the trivial means for doing so either in the current domain, by joining the currents I1 and I2 flowing in two wires, or in the voltage domain, by placing two voltage elements V1 and V2 in series.

Part B of FIG. 1 is a diagram of a circuit 100 that performs a form of multiplication in the voltage domain as is known in the prior art. Input voltages VA and VB create different currents into a virtual ground configuration that sum into feedback resistor R3 and operational amplifier ("op-amp") U2. The output VO is given by:

$$VO = -\left(VA \cdot \frac{R3}{R1} + VB \cdot \frac{R3}{R2}\right) \quad \text{Equation 2}$$

This is both an addition and a multiplication of sorts; however, the multiplication is achieved by conversion from the voltage domain to the current domain and back to the voltage domain again. The multiplication action occurs in that transformation; the resistance, which is fixed at design time, is used to facilitate the multiplication. Further, the result is full multiplication of VA times VB, but rather those voltages are multiplied by R3/R1 and R3/R2, respectively. (To allow the resistance to be adjustable rather than fixed would require an active device as will be seen below in FIG. 2.)

There appears to be no known direct operation on the electrical properties of a circuit (e.g., voltage, current, charge, etc.) that can give rise to multiplication of them. The best that the prior art can achieve is to multiply VA times VB to an arbitrary degree, i.e., the result is an approximation that is sufficiently accurate over a small region, using an active circuit.

Figure 2:
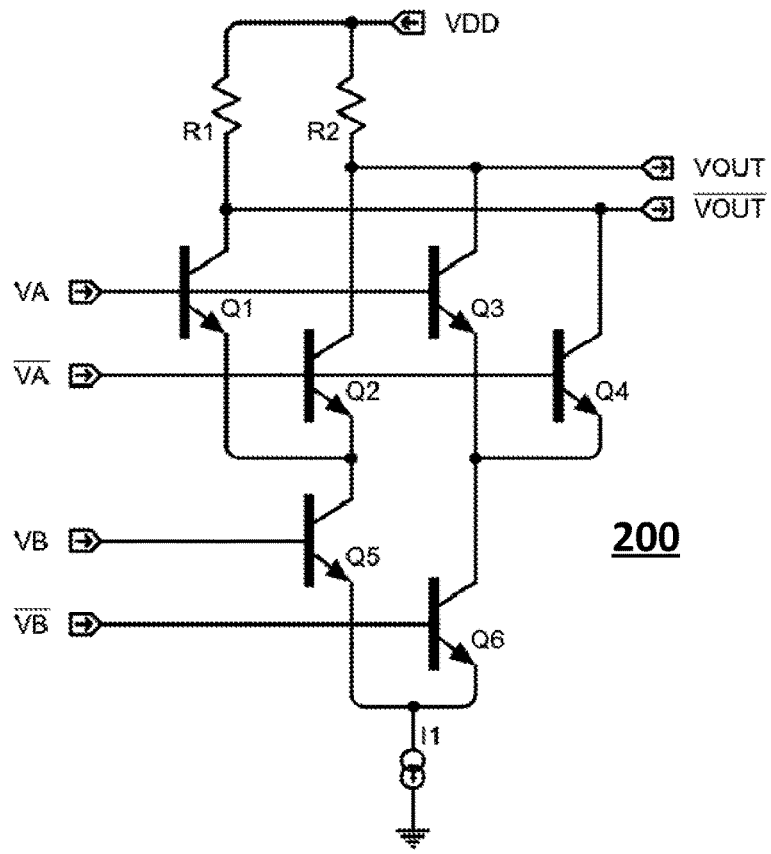
FIG. 2 is a diagram of a circuit that multiplies voltages in a limited fashion as is known in the prior art.

FIG. 2 is a diagram of an active circuit 200 that performs such limited multiplication of voltages, known as a Gilbert multiplier, as is known in the prior art. As with the circuit in part B of FIG. 1 above, circuit 200 transforms from the voltage domain to the (differential) current domain and then back to the voltage domain. The transconductance (inverse of the resistance) is variable due to the exponential relation of the differential output current in the drains (collectors) of transistors Q5 and Q6 to the input differential voltage VB. Thus, a run-time variable "resistance" is created in circuit 200, and this creates the multiplication effect. However, it remains true that the actual circuit properties (voltage, current, etc.) only add. Further, circuit 200 contains 6 transistors and thus requires significant power to operate, as well as being limited by the switching time of the transistors.

Thus, in the known art it appears that any run-time variable multiplication requires an active circuit. Further, the circuit properties, such as voltage, current, charge, etc., do not themselves directly multiply.

Figure 3:
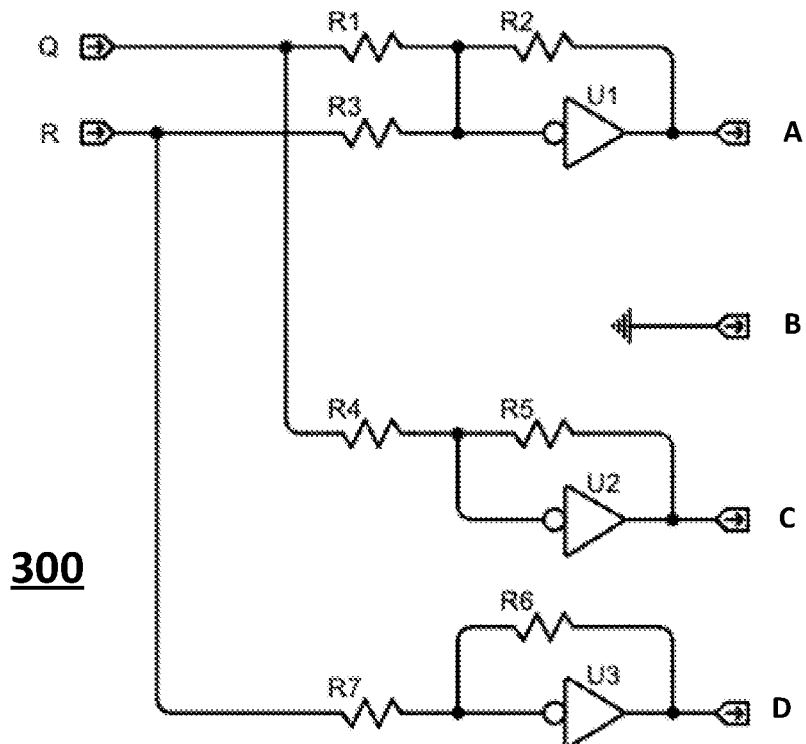
FIG. 3 is a diagram of a circuit for transforming a single ended voltage and a single-ended reference voltage into the signal domain according to one embodiment of the present approach.

FIG. 3 is a diagram of a circuit 300 for transforming a single-ended voltage Q and a single-ended reference voltage R into the signal domain according to one embodiment of the present approach. As above, the signal S is determined from the input voltage Q and reference voltage R, and defined by the four derived voltages A, B, C and D according to the expression of Equation 1, $$S = \frac{A - B + C - D}{A - B - C + D}.$$

Circuit 300 contains three instances of circuit 100 above (two instances are modified by removing a resistor since there is only one input voltage to those instances). In the single ended case, B is zero. All of the resistors R1 through R7 have the same value (unless otherwise noted, this will be true in all of the figures herein). Using Equation 2 above it will be seen that A=−(Q+R), C=−Q, and D=−R. Using these values, Equation 1 reduces to S=Q/R for circuit 300. As above, this signal is both shift and scale invariant, as any shift or scale in value that is applied to all of the derived output voltages A, B, C and D will cancel out in Equation 1 and the resulting signal will not change.

As illustrated, circuit 300 still contains some active components, i.e., inverting amplifiers U1, U2, and U3, as do circuits discussed below. As above, it will be advantageous to eliminate as many of these active devices as possible and instead rely primarily on passive components to achieve the maximum benefit of the present approach. It will be apparent to one skilled in the art in light of the teachings herein how each instance of circuit 100 above contained in any circuit herein from which the output is then passed through a resistance R may instead have its output inverted and then be replaced by a Thevenin equivalent circuit in which the inputs are each passed through resistances of the value 2R and added together, so that no active device is needed.

Figure 4:
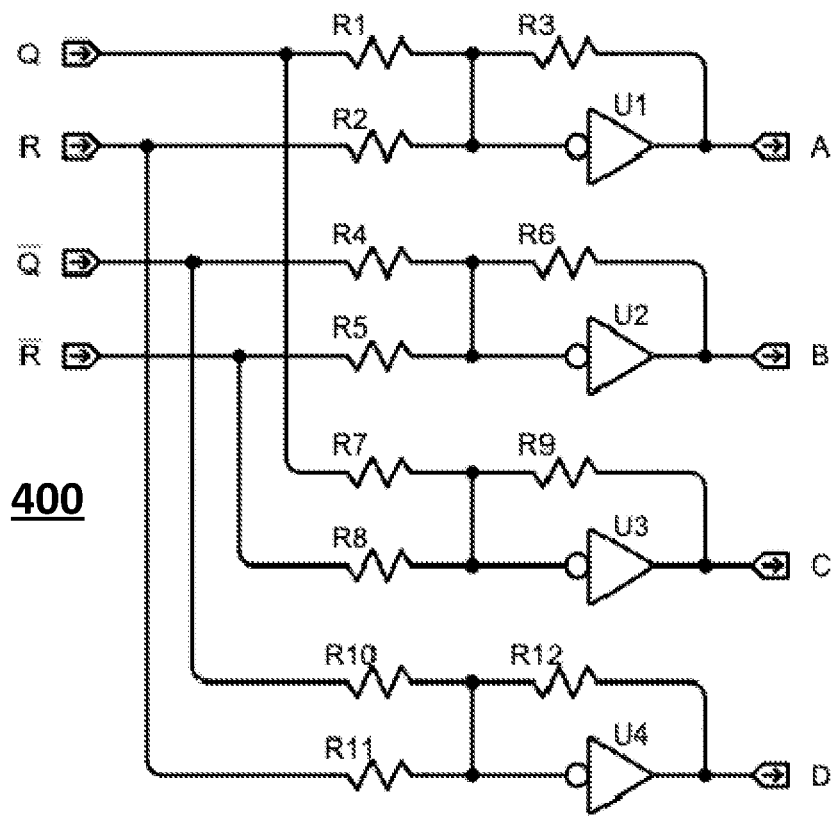
FIG. 4 is a diagram of a circuit for transforming a differential voltage and differential reference voltage into the signal domain according to one embodiment of the present approach.

This approach, and that of other circuits shown below as using single-ended signals, is easily extended to a differential signal. FIG. 4 is a diagram of a circuit for transforming a differential voltage and differential reference voltage into the signal domain according to one embodiment of the present approach. The input voltage is now a differential voltage Q−Qbar (in FIG. 3, Qbar is shown as a Q with a line over it), while the reference voltage is also a differential voltage R−Rbar (similarly, Rbar is an R with a line over it).

In circuit 400 there are now four instances of circuit 100 above, each receiving two input voltages. As above, all of the resistors R1 through R12 have the same value. Again using Equation 2 to find the derived values of A, B, C and D, it will be seen that A=−(Q+R), B=−(Qbar+Rbar), C=−(Q+Rbar), and D=−(Qbar+R). Using these values, Equation 1 reduces to:

$$S = \frac{Q - Qbar}{R - Rbar}$$

i.e., the differential input voltage divided by the differential reference voltage, as is expected.

The inputs Q and Qbar may be from, for example, a ratiometric transducer that produces an output voltage that changes in proportion to some force applied to the transducer. One example is a strain gauge, which produces a voltage output that changes with the pressure applied to the gauge. In a strain gauge the output for a given pressure is proportional to the applied reference. Thus, a strain gauge and other transducers that are built upon the methodology of a Wheatstone bridge are inherently ratiometric and may connect directly to the Q and R inputs of FIG. 4.

Other transducers, such as microphones are not inherently ratiometric but may be provided with a reference voltage and connect to a circuit as shown in FIG. 4. A circuit such as circuit 400 of FIG. 4 may be used to derive a signal from the microphone output that is shift and scale invariant and is not affected by other variables such as electronic noise or temperature, in contrast to the simple voltage output of the microphone which does not have those qualities.

Figure 5:
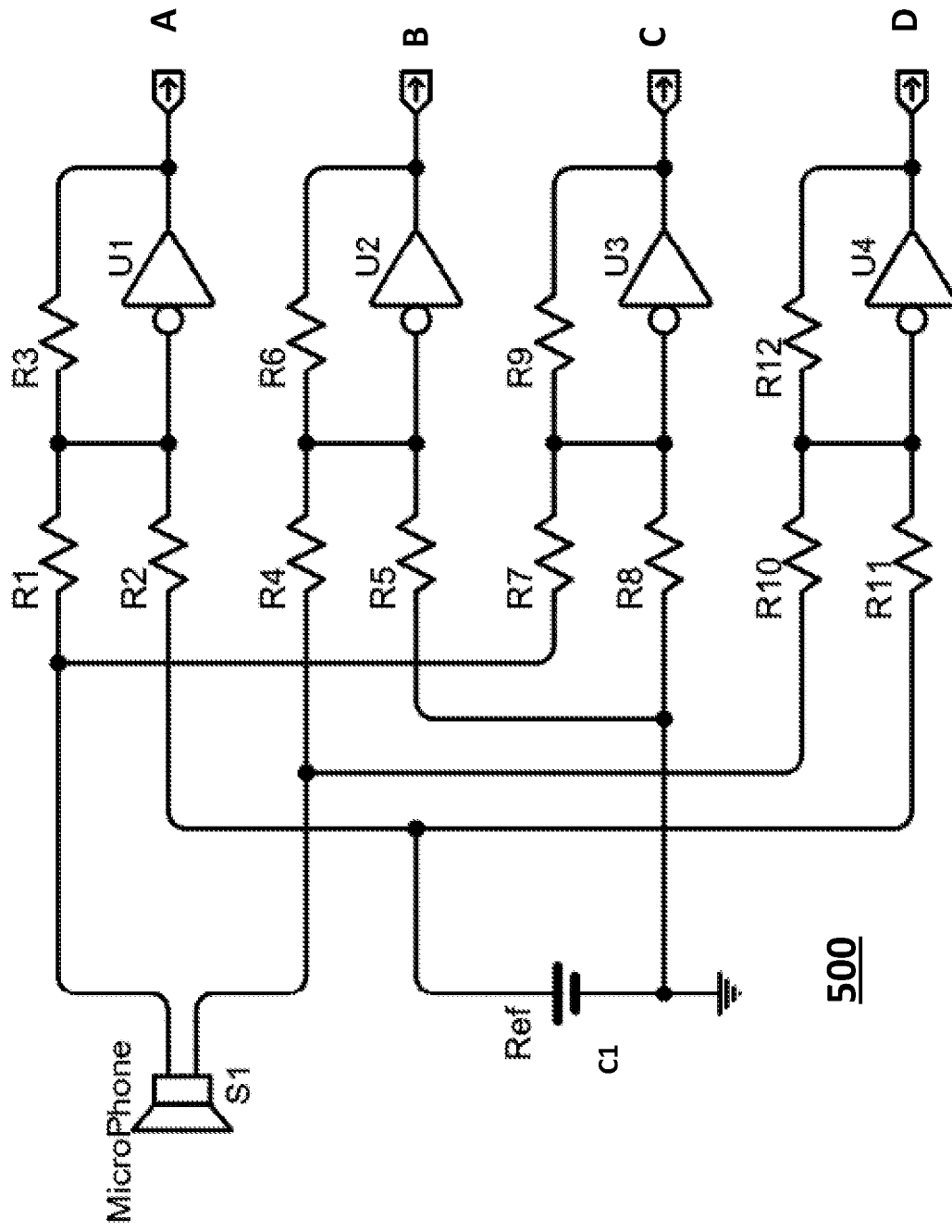
FIG. 5 is a diagram of a circuit that implements the circuit of FIG. 4 to encode a signal originating from a microphone according to one embodiment of the present approach.

FIG. 5 is a diagram of a circuit 500 that implements circuit 400 of FIG. 4 to encode a signal originating from a microphone according to one embodiment of the present approach. The differential voltage output from a microphone S1 provides the Q and Qbar differential input to circuit 400, while a reference voltage Ref that is the input R is provided by a capacitor C1. As shown in FIG. 5, Rbar is ground (alternatively it could be a value of −Ref).

Circuit 500 measures the sound level applied to the microphone relative to the reference voltage Ref. Again the output signal is given by Equation 1 and is:

$$S = \frac{Q - Qbar}{R - Rbar}$$

$$S = \frac{Q - Qbar}{R}$$

since Rbar is ground). Note that varying the reference voltage Ref varies the gain of circuit 500; reducing the reference voltage R increases the output signal S, while increasing the reference voltage R decreases the output signal S.

Addition in the signal domain is achieved by simply applying the outputs of circuits such as circuit 400 of FIG. 4 or circuit 500 of FIG. 5 to a network of linear two-port elements such as resistors, capacitors, or other means known in the art. While the circuits herein are illustrated with resistors, one of skill in the art will appreciate how the circuits may be easily constructed with, for example, capacitors instead of resistors.

Figure 6:
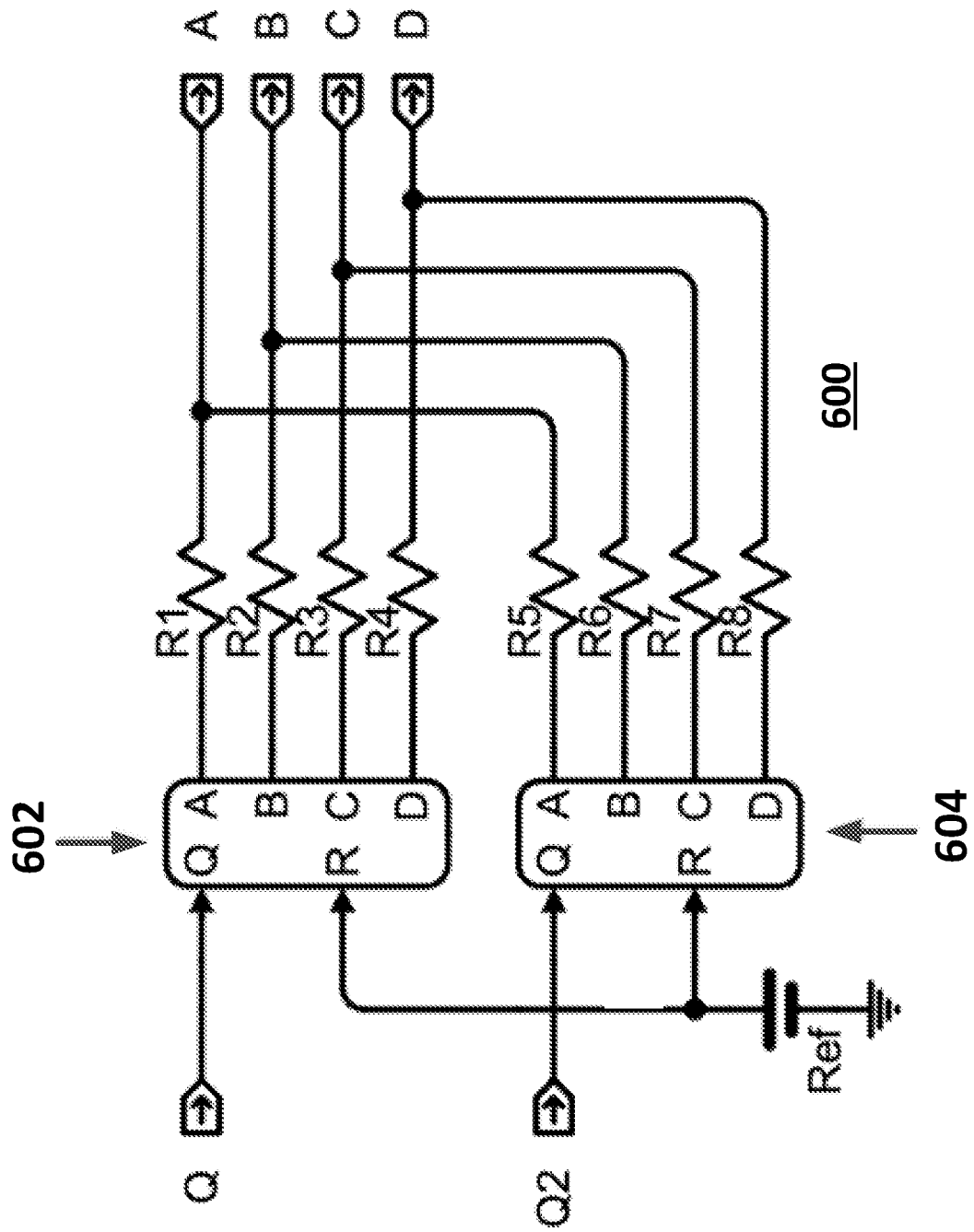
FIG. 6 is a diagram of a circuit in which the outputs of two circuits such as those of FIG. 3, 4 or 5 above are added together in one fashion according to the present approach.

FIG. 6 is a diagram of a circuit 600 in which the outputs of two circuits 400 or 500 as shown above are added together in one fashion according to the present approach.

In circuit 600, the two elements 602 and 604 are each instances of circuit 400 of FIG. 4 above. Passing the derived A, B, C and D outputs of elements 602 and 604 through resistors R1 through R8 and connecting the output of resistor R1 to that of resistor R5, R2 to R6, etc., results in connecting the A output of element 602 to the A output of element 604, the B output of element 602 to the B output of element 604, etc. The resulting values of A, B, C and D on the right of circuit 600 are the sums of the respective derived outputs A, B, C and D from elements 602 and 604.

It will be apparent that the derived A, B, C and D outputs of element 602 are not the same as the derived outputs of element 604, as element 602 receives voltage Q and element 604 receives voltage Q2. For ease of reference, each resistor network herein is assumed to have four derived outputs A, B, C and D, recognizing that each resistor network has derived outputs corresponding to its input as described herein. In some applications or discussions, the outputs of different resistor networks may be distinguished from one another by, for example, calling the derived outputs of one resistor network A1, B1, C1, and D1, and the outputs of another resistor network A2, B2, C2, and D2, etc.

Figure 7:
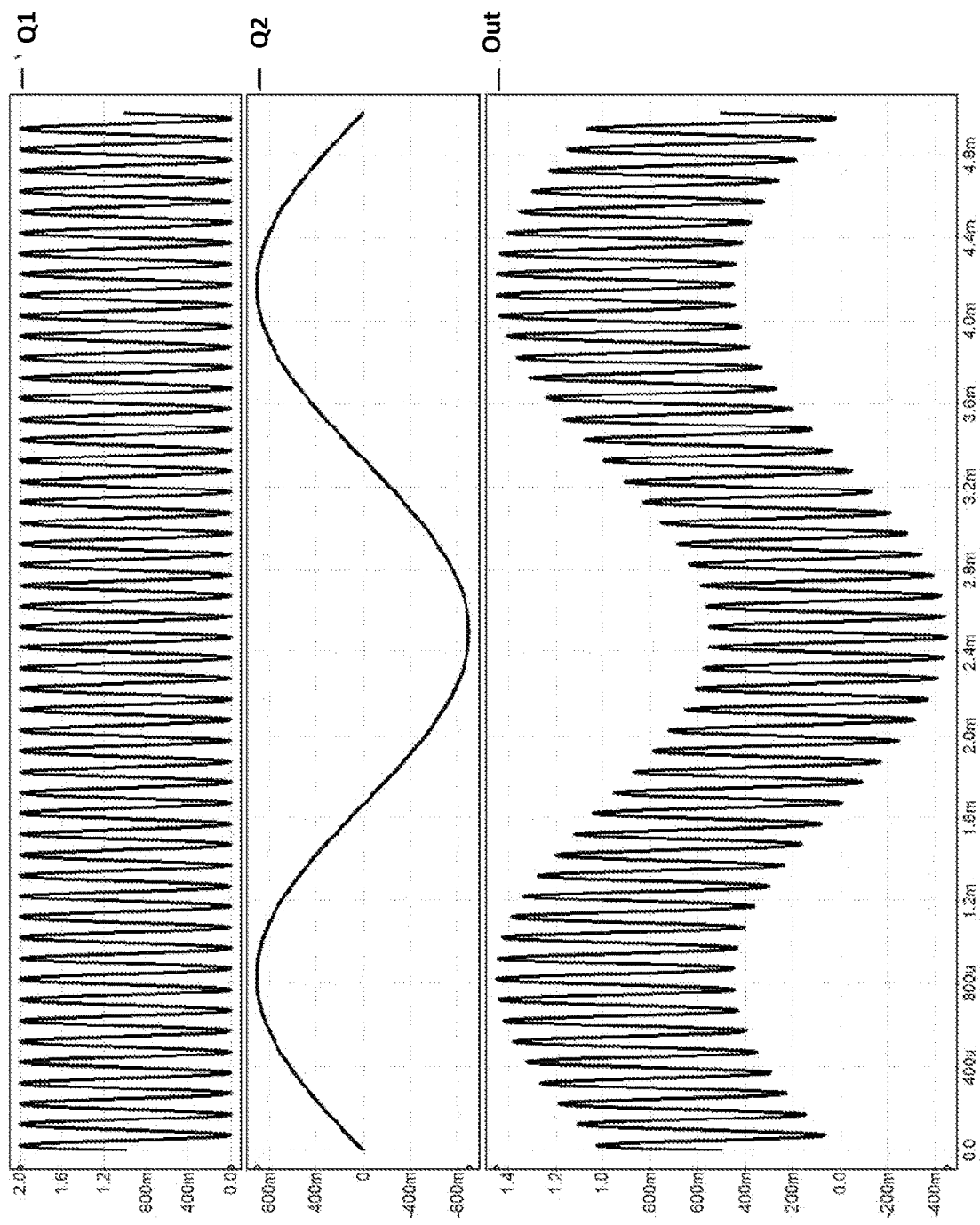
FIG. 7 is a series of graphs showing the operation of circuit 600 of FIG. 6 according to the present approach.

FIG. 7 is a series of graphs showing the operation of circuit 600 of FIG. 6 according to the present approach. The top graph shows a voltage Q1 that is applied to circuit 602 in the form of a sine wave of 10 kilohertz (kHz) ranging from 0 to 2 volts, while the middle graph shows another voltage Q2 that is applied to circuit 604 in the form of a sine wave of 300 hertz (Hz) ranging from 800 millivolts (mv) to −800 mv.

The two resulting signals are:

$$Q=1+\sin(2\pi 10k \cdot t)$$

$$Q2=0.9 \cdot \sin(2\pi 300 \cdot t)$$

(As above, the output of a circuit 400 such as element 602 or 604 is Q/R, where Q is the voltage applied to that circuit and R is a reference voltage. For simplicity, it is here assumed that the reference voltage is unity so that the output is the same as the input in this instance.)

The bottom graph shows the addition of these two signals, resulting in an output:

$$\text{Out} = \frac{Q+Q2}{2} \qquad \text{Equation 3}$$

As expected, the 10 kHz sine wave is superimposed on the 300 Hz sine wave.

Circuit 600 results in a combined value of each of the A, B, C and D outputs. However, it is not necessary that the A outputs be summed, the B outputs be summed, etc., as in circuit 600.

It will be apparent from the equations above that reversing the connections between the resistors in circuit 600 of FIG. 6, so that the output of resistor R1 is connected to that of resistor R8, R2 to R7, R3 to R6 and R4 to R5, will cause the output to be the difference between Q and Q2 rather than the sum, and will thus result in a combined output of (Q−Q2)/2.

Figure 8:
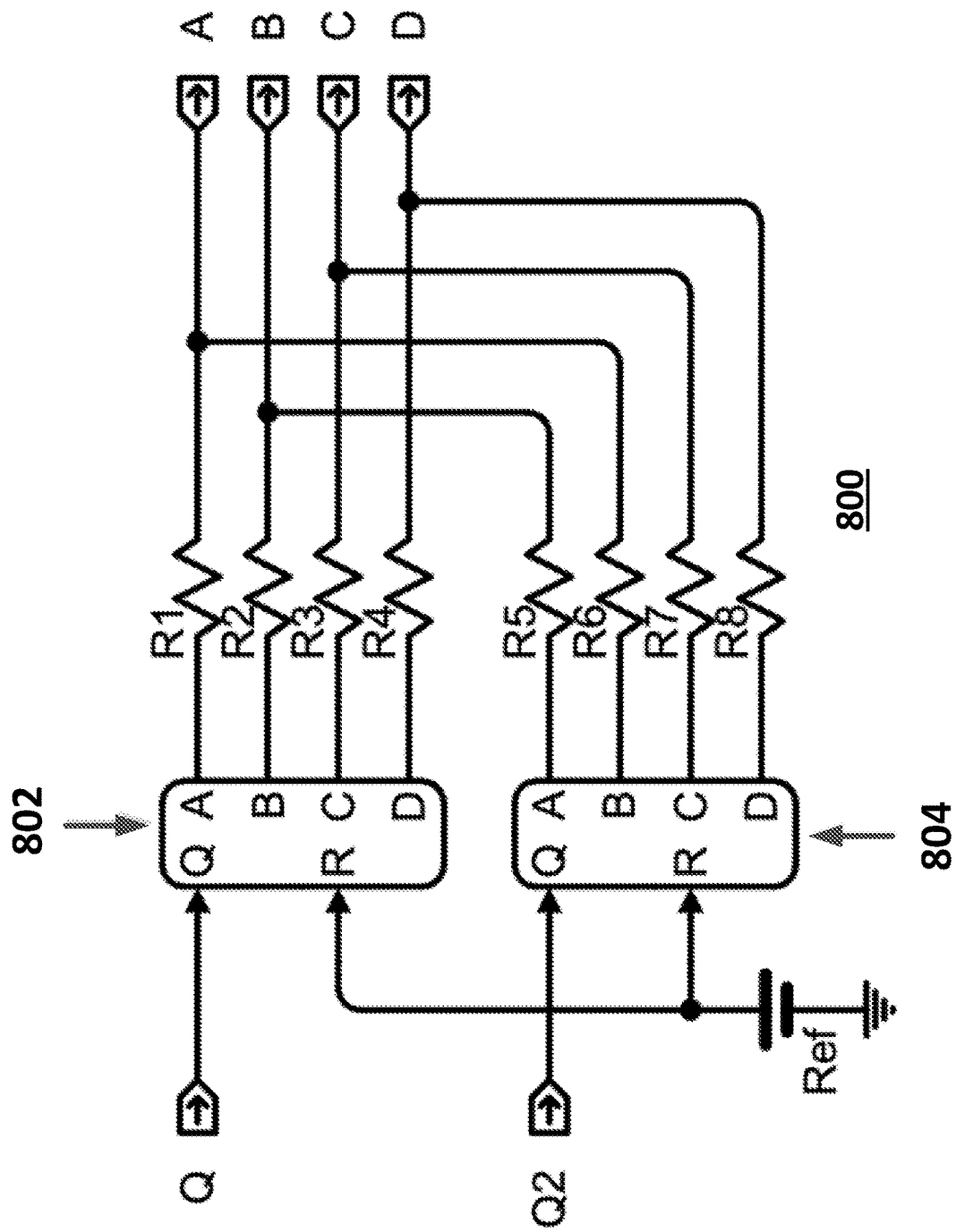
FIG. 8 is a diagram of a circuit in which the outputs of two circuits such as those of Figures or 5 above are added together in another fashion according to the present approach.

FIG. 8 is a diagram of a circuit 800 in which the outputs of two circuits 400 or 500 as shown above are added together in another fashion according to the present approach.

In circuit 800, instead of the A outputs being connected together and the B outputs being connected together as in circuit 600 of FIG. 6, the A output of element 802 is connected with the B output of element 804, and the B output of element 802 is connected with the A output of element 804. (The C outputs are still connected together, as are the D outputs.) The same inputs are applied as in FIG. 6, i.e., again Q1 is a 10 kHz sine wave and Q2 is a 300 Hz sine wave.

Figure 9:
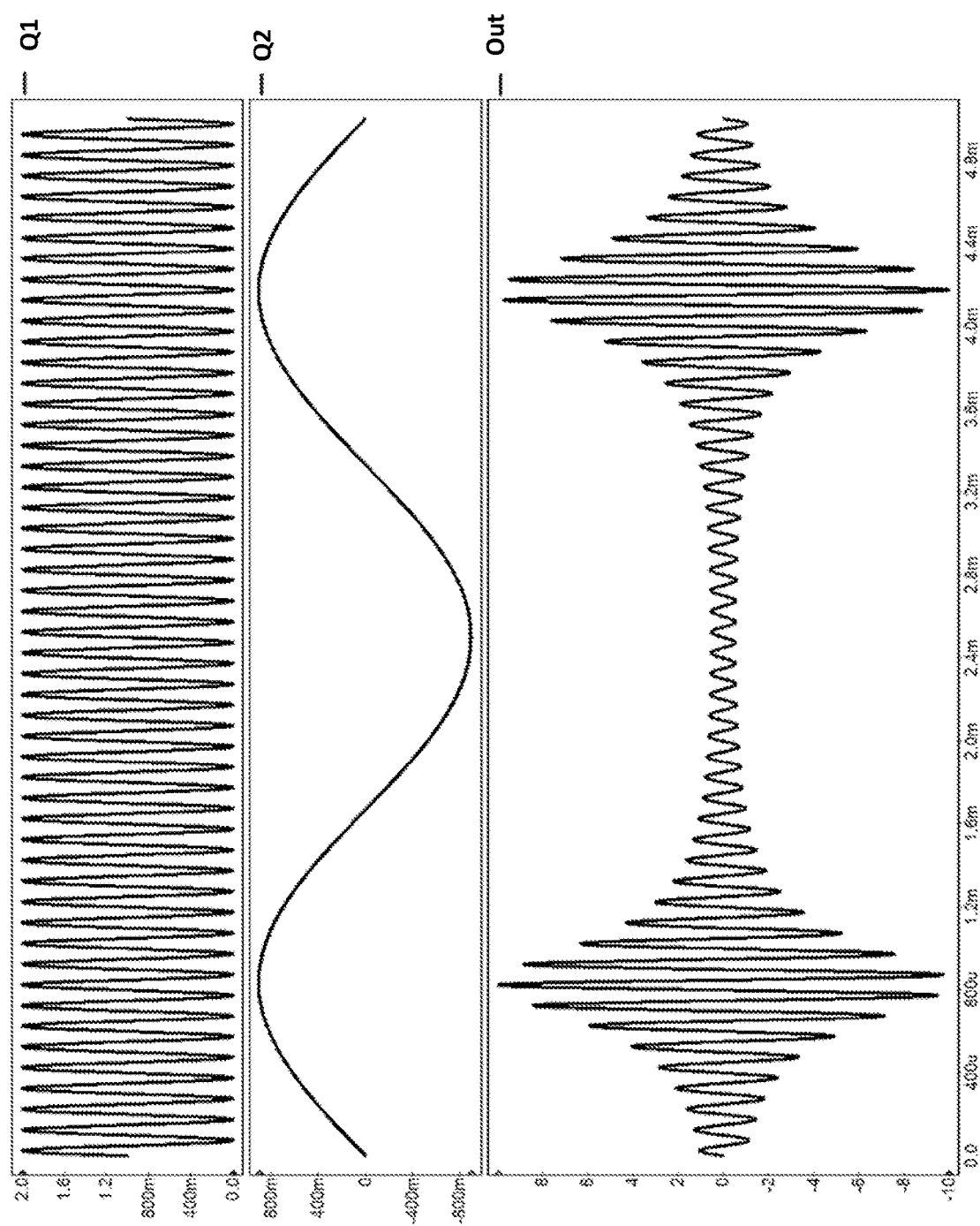
FIG. 9 is a series of graphs showing the operation of circuit 800 of FIG. 8 according to the present approach.

FIG. 9 is a series of graphs showing the operation of circuit 800 of FIG. 8 according to the present approach. As in FIG. 7, the top graph shows a voltage Q1 that is applied to circuit 802 in the form of a sine wave of 10 kilohertz (kHz) ranging from 0 to 2 volts, while the middle graph shows another voltage Q2 that is applied to circuit 804 in the form of a sine wave of 300 hertz (Hz) ranging from 800 millivolts (mv) to −800 mv.

The bottom graph shows the addition of these two signals, with the A and B values cross-coupled as described. When the signals from elements 802 and 804 in circuit 800 are added together, and then the overall signal is determined from the resulting A, B, C and D on the right side of FIG. 8 according to Equation 1 above, the result is now: by:

$$\text{Out} = \frac{Q1-1}{1-Q2} \qquad \text{Equation 4}$$

By using the linear components, i.e., resistors, in this fashion, the determination of the signal Out involves a division. Note that it is not possible to find a circuit property that can be plotted as in the lower graph of FIG. 9; rather, it is the interpretation of a signal from circuit properties that allows this functionality.

In some instances, it will be seen that being able to derive a signal having a unity value, i.e., a value of 1, or a value of 2 will be useful for operations on signals determined according to the current approach. The application of this is discussed below. Generating such a signal is easy using circuits of the type described herein.

Figure 10:
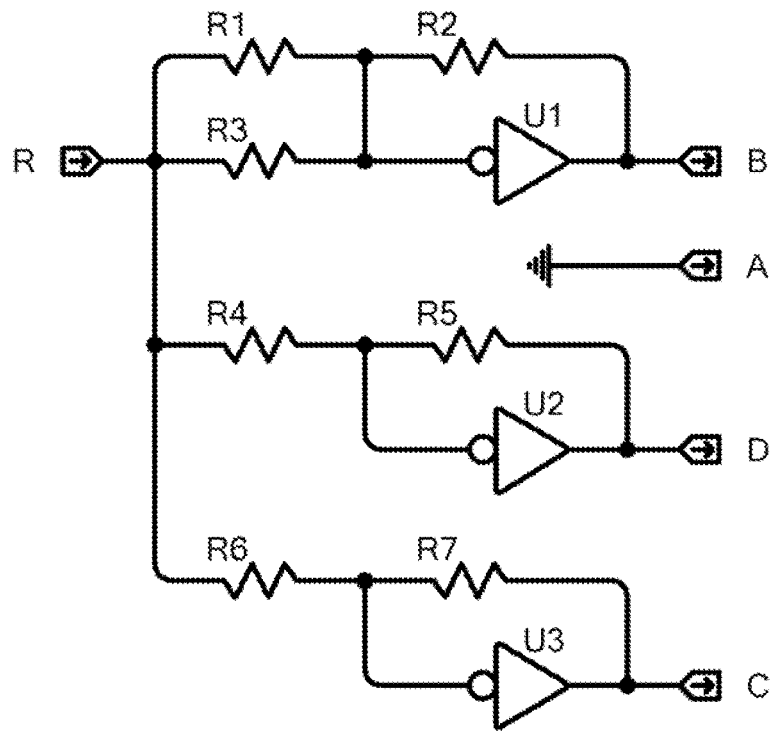
FIG. 10 is a diagram of a circuit that generates a unity value according to one embodiment of the present approach.

FIG. 10 is a diagram of a circuit 1000 that generates a unity value from a reference voltage according to one embodiment of the present approach. Again all of the resistors in circuit 1000 have the same value. Equation 2 above determines the respective derived values of B, C and D (A is zero volts) with respect to the single-ended reference voltage R; putting these values into Equation 1 above, it will be seen that the output is unity, i.e., a value of 1.

Figure 11:
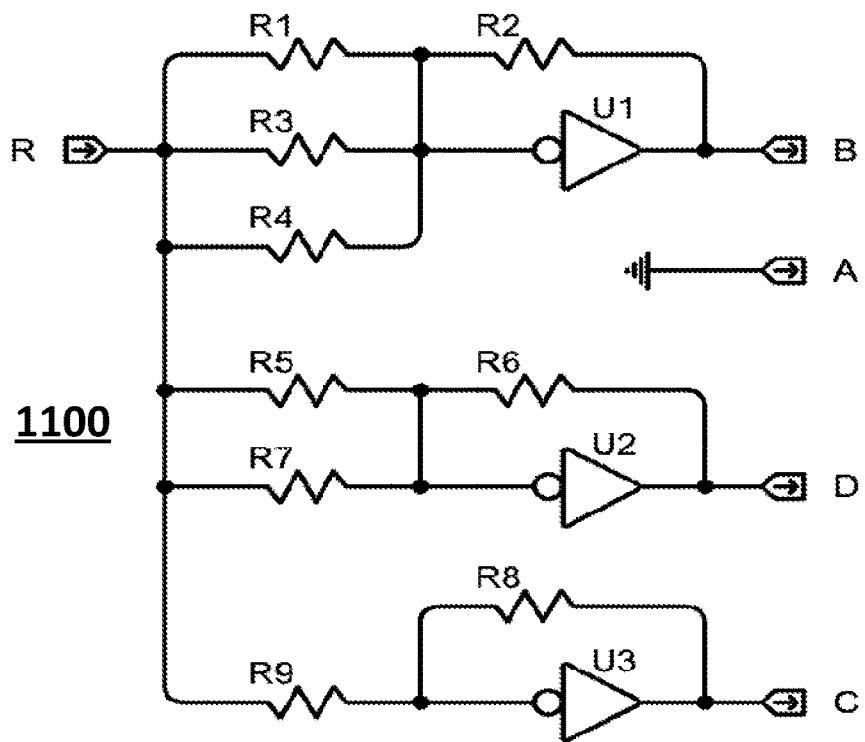
FIG. 11 is a diagram of a circuit that generates a value of twice the unity value according to one embodiment of the present approach.

FIG. 11 is a diagram of a circuit 1100 that generates a value of twice the unity value from a reference voltage according to one embodiment of the present approach. As in circuit 1000 of FIG. 10, all of the resistors have the same value. However, now the value of the B output is increased relative to that of the B output in circuit 1000 due to the presence of another resistor (R4) in that portion of circuit 1100 that produces the B output. While output C is the same as in circuit 1000, in circuit 1100 output D is different, again due to the presence of an additional resistor in producing that output. Again using Equation 2 to determine the values of B, C and D, (A is again zero volts) and inserting the results in Equation 1, the output of circuit 1100 is a value of 2.

Figure 12:
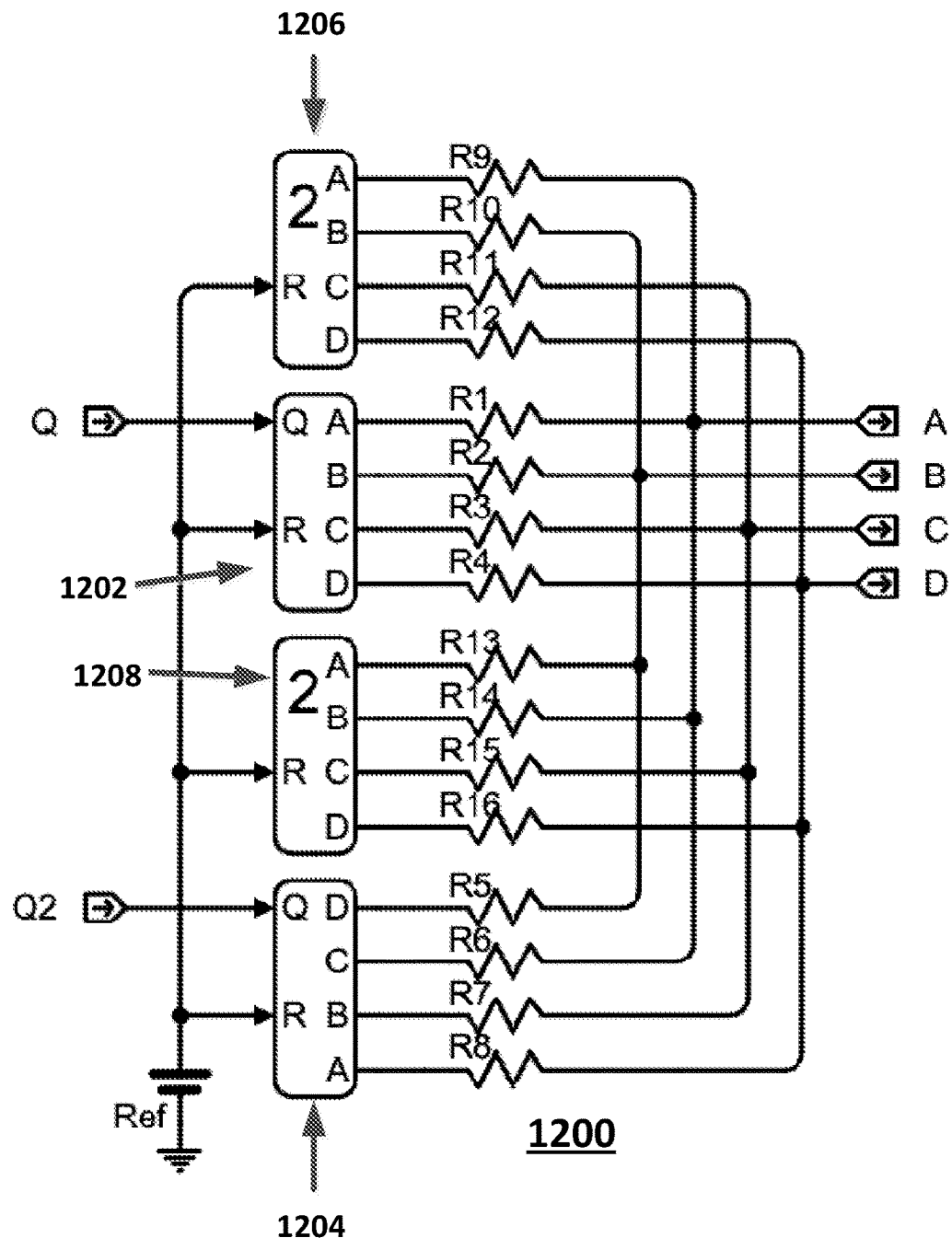
FIG. 12 is a diagram of a circuit that combines the circuits of FIGS. 8 and 11 to achieve division in the signal domain.

FIG. 12 is a diagram of a circuit 1200 that combines the circuits 800 and 1100 of FIGS. 8 and 11 respectively to achieve division in the signal domain.

In circuit 1200, elements 1202 and 1204 are instances of circuit 400 of FIG. 4, while elements 1206 and 1208 are instances of circuit 1100 of FIG. 11; as above, circuit 1100 generates a value of 2. The derived A, B, C and D outputs of the elements 1202, 1204, 1206 and 1208 are connected as shown.

The outputs of the upper elements 1202 and 1206 are coupled in the same way as elements 602 and 604 of FIG. 6, i.e., each output A, B, C and D of element 1202 is coupled to the corresponding output A, B, C and D of element 1206 so that the combined output of elements 1202 and 1206 is (2+Q)/2 as in Equation 3.

The lower elements 1204 and 1208 are connected in reverse order, so that each A output is coupled to the other D output and each B output to the other C output. This causes the addition in Equation 3 to become a subtraction, so that the combined output of elements 1204 and 1208 is (2−Q2)/2.

The two pairs of elements, the first pair of elements 1202 and 1206, and the second pair of elements 1204 and 1208, are connected in the same way as elements 802 and 804 of FIG. 8. Substituting (2+Q)/2 for Q and (2−Q2)/2 for Q2 in Equation 4 results in:

$$\text{Out} = \frac{\frac{2+Q}{2}-1}{1-\frac{2-Q2}{2}}$$

which reduces to:

$$\text{Out} = \frac{Q}{Q2}$$

Figure 13:
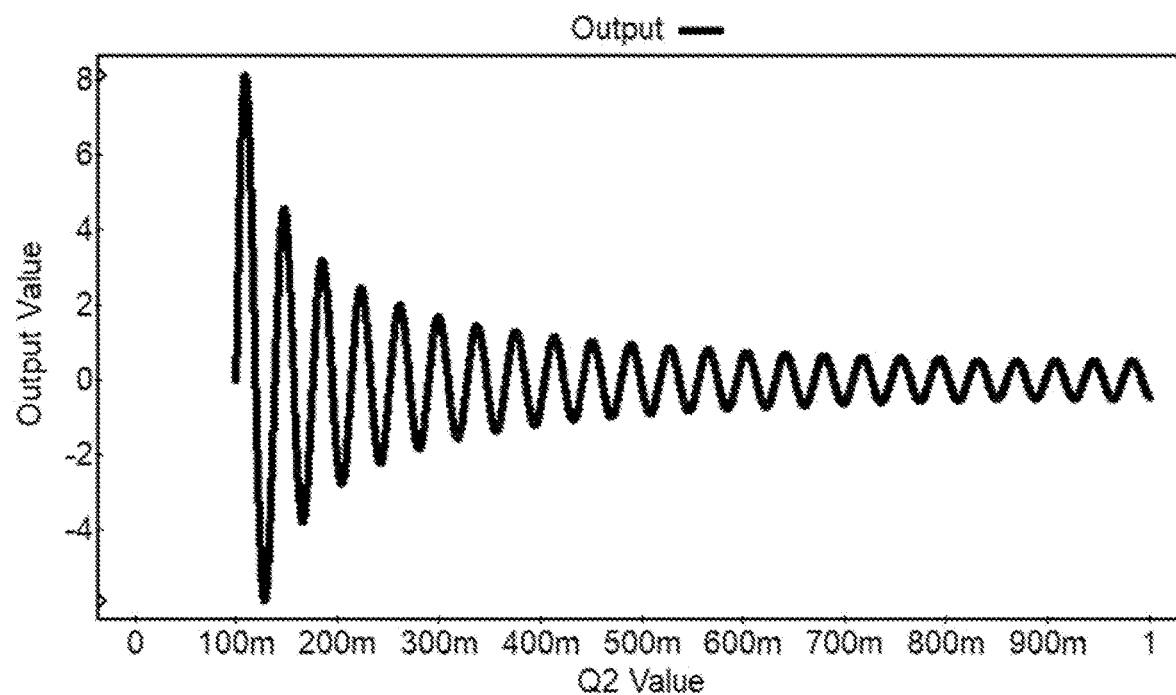
FIG. 13 is a graph showing the operation of the circuit of FIG. 12 according to one embodiment of the present approach.

FIG. 13 is a graph showing the operation of circuit 1200 of FIG. 12 according to one embodiment of the present approach. As the value of Q2 gets smaller, the gain of circuit 1200 increases, as expected from its output of Q/Q2.

These circuits illustrate that both addition and division are possible in the analog signal domain, as are thus their inverses, subtraction and multiplication, without any non-linear elements and without active components. Again, note that it is not the analog property that is being divided; rather, the division operation is present in the interpretation of the signal and not in the circuit property itself. If one wishes to convert the signal back to a circuit property, such as voltage, the means for converting will itself have to implement a circuit that performs division.

Several useful devices may thus be implemented entirely in the analog domain, thus adding more flexibility to electronic circuit designs. For example, input channels from a transducer may be augmented with adjustable, voltage-controlled gains, and without any active components or additional noise or distortion.

Figure 14:
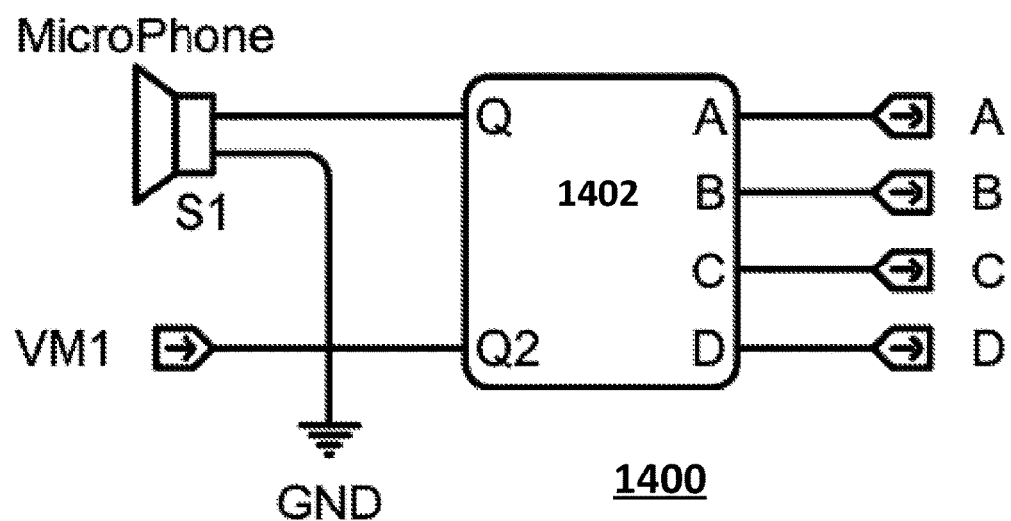
FIG. 14 is a diagram of a voltage controlled amplifier circuit that varies the gain of a microphone output signal according to one embodiment of the present approach.

FIG. 14 is a diagram of a voltage controlled amplifier circuit 1400 that varies the gain of a microphone output signal according to one embodiment of the present approach. In circuit 1400, the element 1402 is circuit 1200 of FIG. 12, which provides outputs A, B, C and D that, as above, result in an output signal Q/Q2. As above, element 1402 contains four resistor networks, i.e., elements 1202, 1204, 1206 and 1208 in FIG. 12 above, to create shift and scale invariant signals to result in an output of Q/Q2. In circuit 1400, Q is the voltage received from the microphone S1, while Q2 is an input voltage VM1 that may be adjusted.

As shown in FIGS. 12 and 13 above, as VM1, and thus Q2, is lowered, the value of Q/Q2, and thus the gain of circuit 1400, increases; conversely, increasing Q2 will decrease the output signal and thus the gain. Thus, circuit 1400 achieves an adjustable, voltage-controlled gain, without active components or additional noise or distortion. While circuit 1400 is shown as having a single-ended input, one of skill in the art will appreciate how to operate such a circuit with a differential input.

Figure 15:
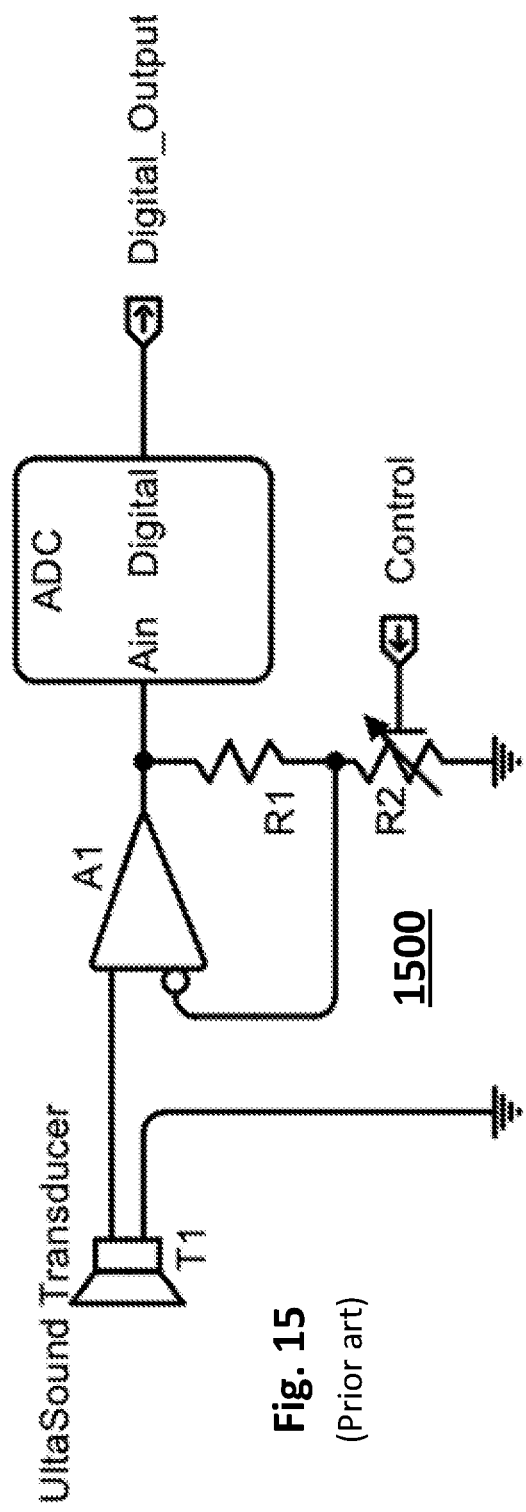
FIG. 15 is a diagram of a time-gain amplifier circuit that varies the gain of an ultrasound transducer output signal as known in the prior art.

FIG. 15 is a diagram of a time-gain amplifier circuit 1500 that varies the gain of a microphone output signal as known in the prior art. Such circuits are often used in applications such as ultrasound detectors, where it is desirable to have gain increase exponentially over time to track a reflected pulse that has an exponential decay. In the prior art such as circuit 1500, this is done by having a digital controller increase the gain of the amplifier as the ever-diminishing pulse impinges on transducer T1. In circuit 1500 this is achieved by a non-linear means which is controlled by the signal Control to alter the gain of amplifier A1. A conventional ADC converts the signal to a digital value. While the non-linear means is here shown as a variable resistance in the feedback loop, other well-known means for doing this exist in the prior art. Again, a circuit of this type uses active components.

Figure 16:
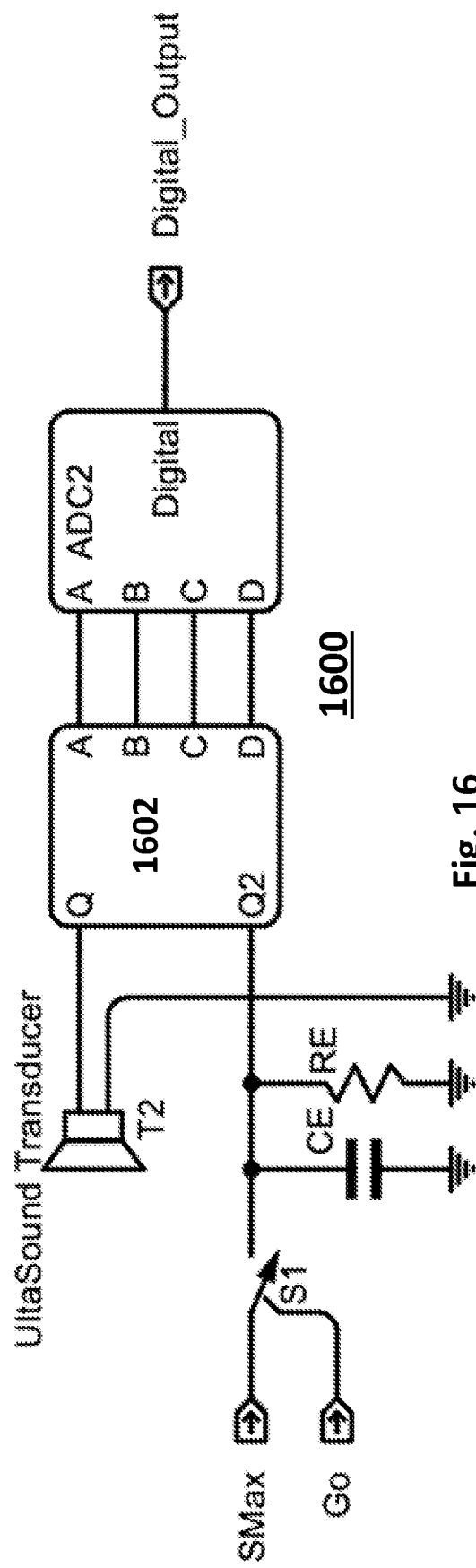
FIG. 16 is a diagram of a time-gain amplifier circuit that varies the gain of an ultrasound transducer output signal according to one embodiment of the present approach.

FIG. 16 is a diagram of a time-gain amplifier circuit 1600 that varies the gain of a microphone output signal according to one embodiment of the present approach. Circuit 1600 implements the same functionality as circuit 1500 of FIG. 15, but again without any non-linear or active elements. Element 1602 is again an instance of circuit 1200 of FIG. 12, and again contains four resistor networks, i.e., elements 1202, 1204, 1206 and 1208 in FIG. 12 above, to create shift and scale invariant signals to result in an output of Q/Q2.

Circuit 1600 includes a control circuit containing a switch S1 connected to a voltage source SMax and controlled by a control signal Go, a capacitor CE and a resistor RE. In circuit 1600, the signal Go is taken high between pulses of the ultrasound driver to close switch S1. When this occurs, the voltage SMax appears as Q2, the divisor input of element 1602, and charges capacitor CE. At the moment of first receiving a reflected signal T in the input transducer T2, the signal value is thus T/SMax. Control signal Go then opens switch S1. The envelope of the reflected signal T rapidly diminishes as the reflections return exponentially weaker as the reflection penetrates deeper into the body or other material being examined. The gain increases to compensate for the decaying signal T due to resistor RE discharging capacitor CE, causing the value of Q2 to fall and thus the gain of the amplifier, which is again Q/Q2, to rise exponentially at the rate of the RC constant.

In circuit 1600, the linear element 1602 has replaced the non-linear time-gain amplifier 1500 of FIG. 15. While the signal from transducer T2 is boosted similarly by circuit 1600 to that of transducer T1 in circuit 1500, no additional power is required for a time-gain amplifier in circuit 1600, and no complex means is needed to generate the exponential gain increase. As will be seen below, it is also possible to use an ADC constructed according to the present approach as ADC2 in circuit 1600, rather than a conventional ADC as in the prior art.

In many applications, and as will be seen below, it is often useful to multiply a signal by a constant that is known at the time of design and construction of the circuit. For example, in an ADC, it is determined whether a value is over a threshold; if it is, a "1" bit is created and the remainder is multiplied by 2 and passed on for determination of a next bit. If the value is under the threshold, a "0" bit is created and the value is again doubled and passed on to find the next bit. This can be accomplished in the analog domain using the present approach.

Another useful function is to shift a signal by a certain amount. This may be desirable to, for example, keep a circuit property such as voltage within a reasonable limit, such as between the positive and negative power supply. Still another useful function is to determine whether the sign of a signal is positive or negative. These functions can also be achieved with the present approach.

Figure 17:
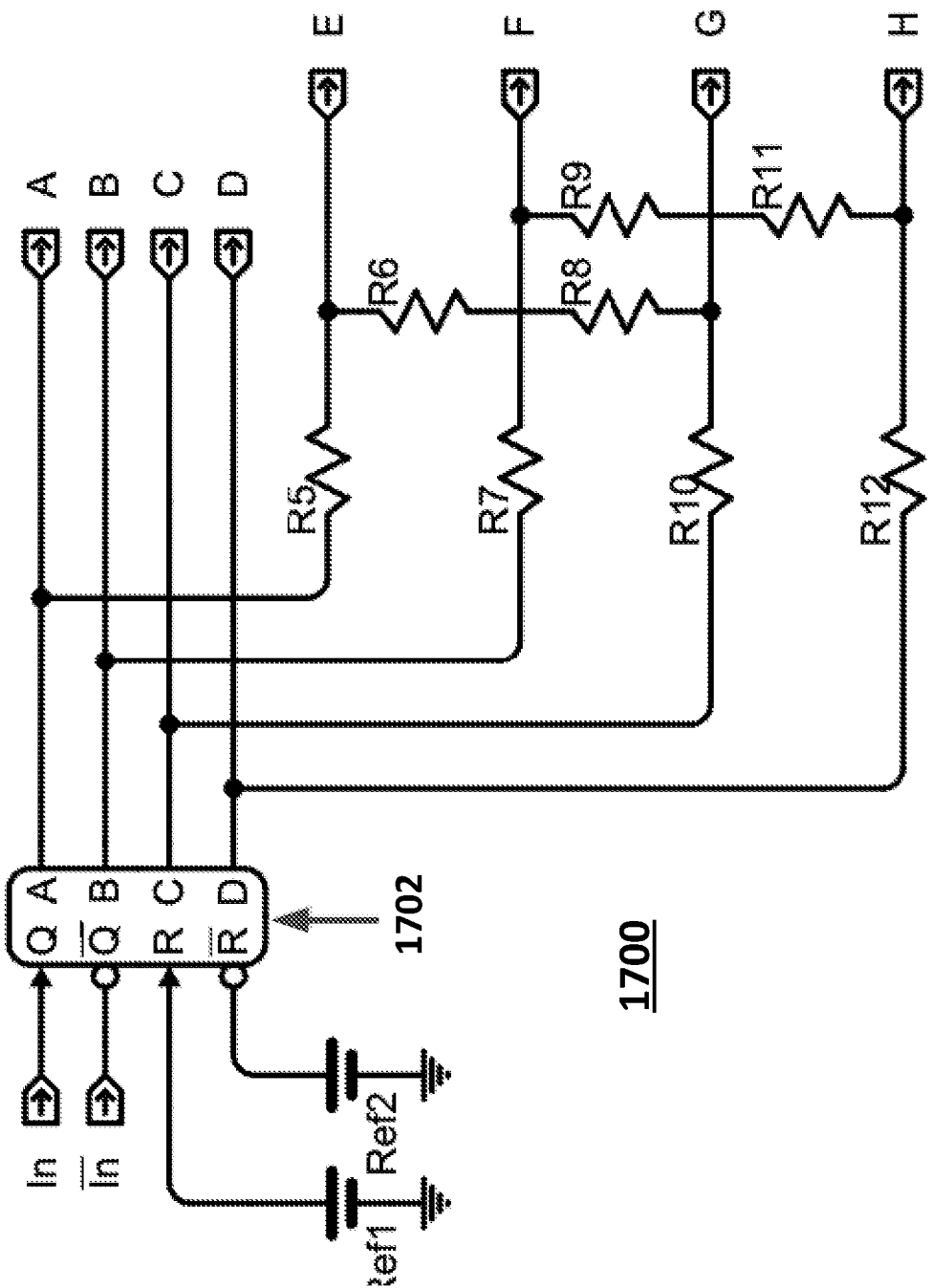
FIG. 17 is a diagram of a circuit that multiplies a signal by a constant according to one embodiment of the present approach.

FIG. 17 is a diagram of a circuit 1700 that multiplies a signal by a constant according to one embodiment of the present approach. Element 1702 of circuit 1700 is an instance of circuit 400 of FIG. 4 that produces an output of Q/R, where Q in circuit 1700 is an input value In; all of the resistors again have the same value. The multiplication is achieved by connecting the A, B, C and D outputs to resistors R5 to R12 connected as shown.

It will be apparent that if the values A, B, C and D are passed only through resistors R5, R7, R10 and R12, a signal determined using the values E, F, G and H in place of the values A, B, C and D in Equation 1 above will result in the same signal as a signal determined using the values A, B, C and D. However, the addition of resistors R6, R8, R9 and R11 alters the output, such that a signal determined using the values E, F, G and H in place of the values A, B, C and D in Equation 1 above will result in a signal twice as great as a signal determined using the values A, B, C and D. The additional resistors result in an increase in gain, i.e., a gain of two.

This result may seem counterintuitive; if Ref1 is 1 V and Ref2 is −1 V, the values of A, B, C and D will be between 1 and −1. Adding resistors R6, R8, R9 and R11 allows E, F, G and H to be between 2 and −2. Note that these are values, not absolute voltages; the resistors attenuate voltages, but the formula of Equation 1 makes the signal derived from the circuit larger as the denominator gets smaller.

Figure 18:
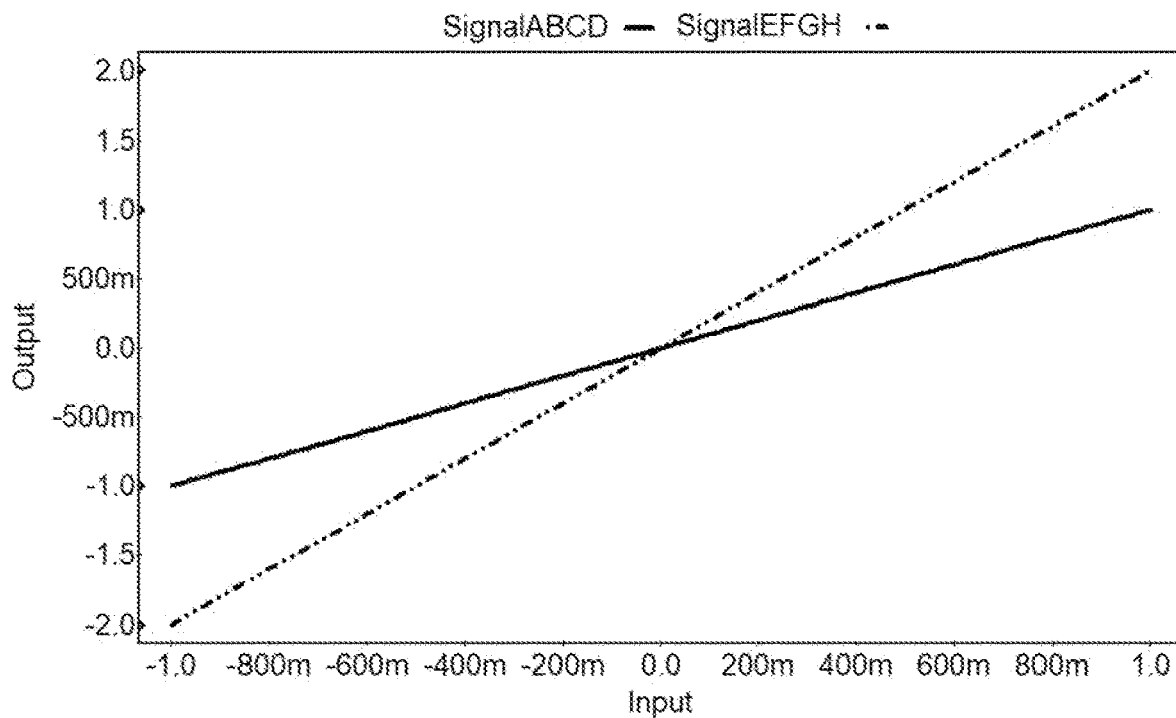
FIG. 18 is a graph showing the operation of the circuit of FIG. 17 according to one embodiment of the present approach.

FIG. 18 is a graph showing the operation of the circuit of FIG. 17 according to one embodiment of the present approach. The gain is two, as expected. This gain in the interpretation of the signal has again been achieved without any active components. Note that this gain is again in the interpretation of the signal as extracted from the voltage properties of circuit 1700 using Equation 1 above; FIG. 18 does not show any voltage in the circuit.

In the known art, the addition and subtraction of a constant value from a property requires an element defining the scale. For example, adding one volt to a voltage on a wire implies that a volt is defined in some part of the system so that the system "knows" what a volt is. In some cases, a device having a known voltage, for example, a reference voltage Zener diode, can be used.

By contrast, signals carry a "reference" with them. Circuit 1700 of FIG. 17 multiplies the signal by two no matter what the value of the resistors, or the actual voltages on the wires. To achieve addition of a constant value is a slightly different problem; in this case, the "reference" part of the signal is extracted and used to add or subtract a constant from the signal. This means that addition and subtraction are also independent of the absolute element values or circuit properties.

Figure 19:
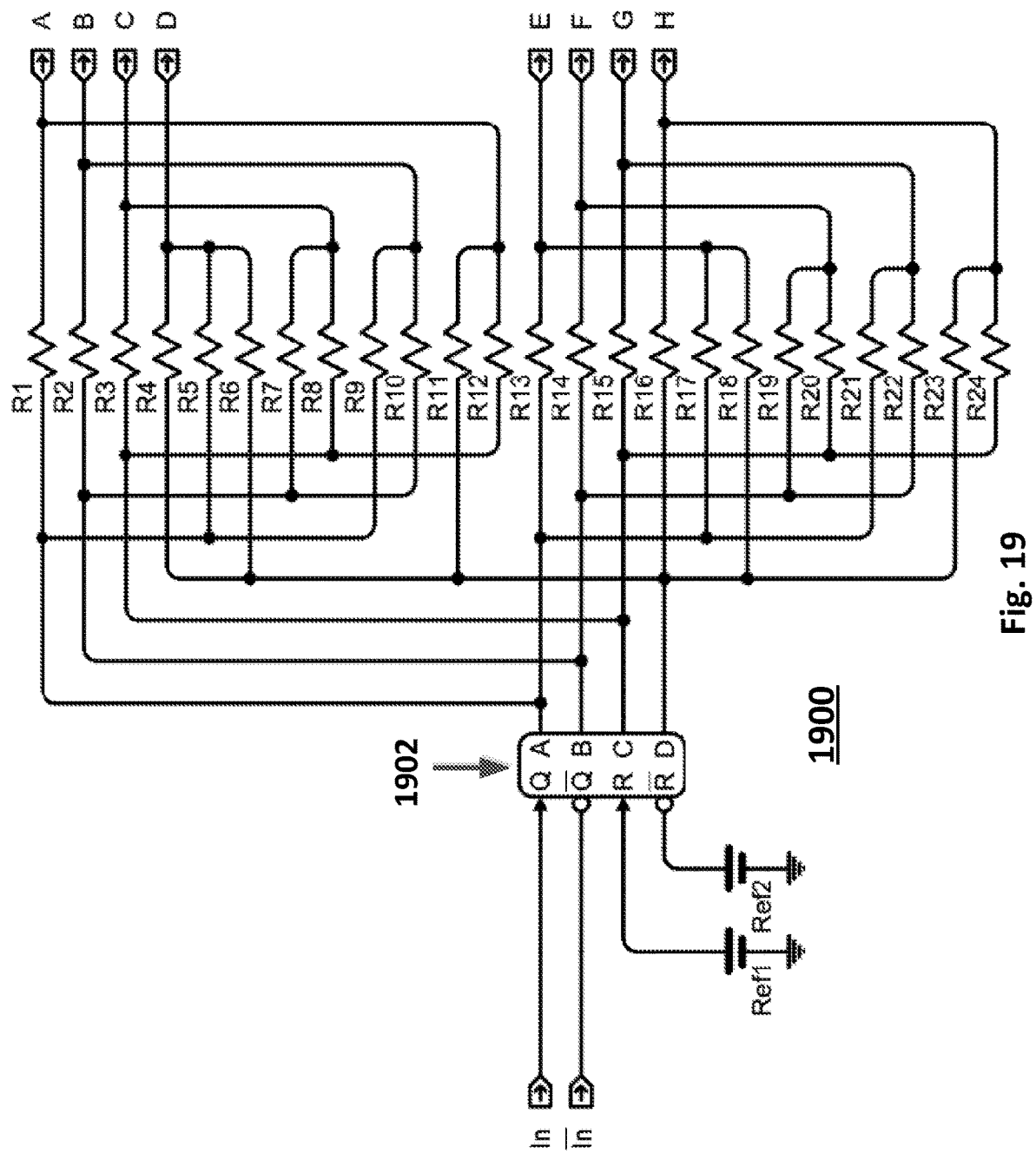
FIG. 19 is a diagram of a circuit that is able to add and subtract a constant value from a signal according to one embodiment of the present approach.

FIG. 19 is a diagram of a circuit 1900 that adds and subtracts a constant value from a signal according to one embodiment of the present approach. Element 1902 may be any of the circuits above that produce four derived values A, B, C and D as outputs that are used to define a signal based upon the inputs In and Inbar and reference voltages Ref1 and Ref2.

The upper resistor network containing resistors R1 to R12 produces four outputs A, B, C and D; the signal derived from these outputs subtracts one from the signal emerging from element 1902 and halves the result. On the other hand, the lower resistor network of resistors R13 to R24 produce four outputs E, F, G, and H; the signal derived from these outputs adds one to the signal from element 1902 and halves that total. While the connections appear complex, the encoding of Equation 1 results in the sum of A and D and the sum of B and C being constant in both the upper and lower resistor networks. These sums are thus the reference value for this particular shift and scaled signal. These constants may then be resistively added or subtracted from the signal output by element 1902.

Figure 20:
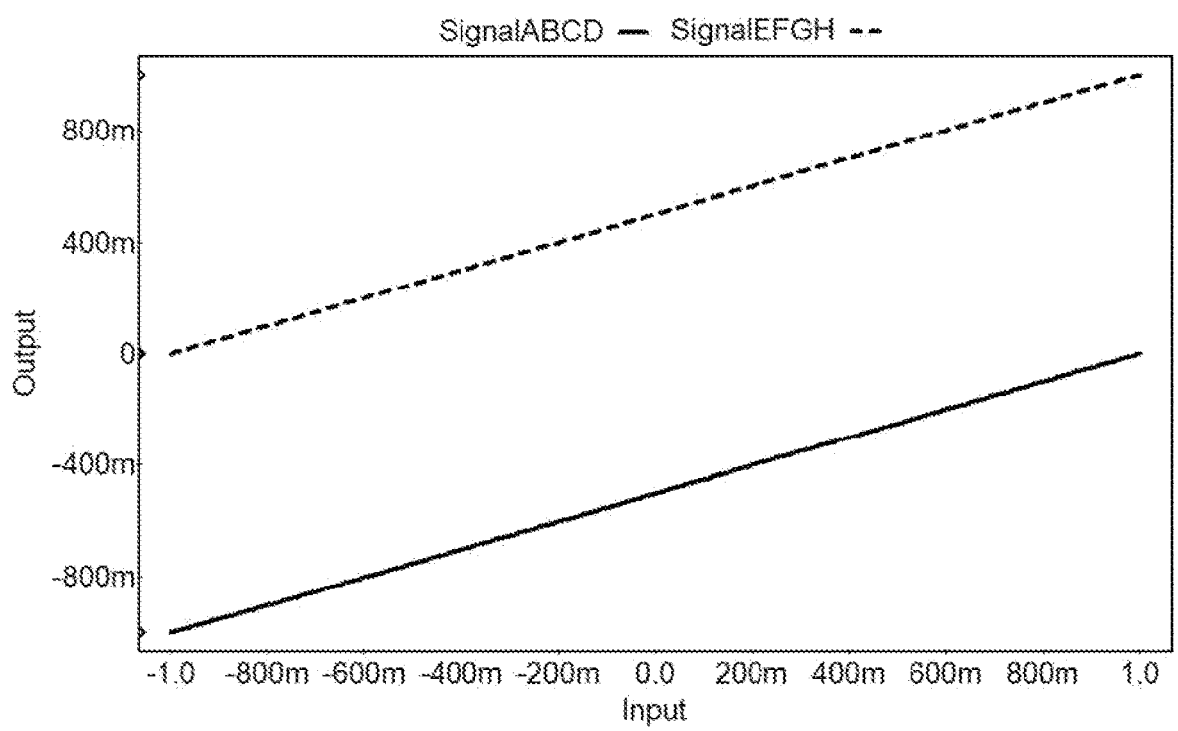
FIG. 20 is a graph showing the operation of the circuit of FIG. 19 according to one embodiment of the present approach.

FIG. 20 is a graph showing the operation of circuit 1900 of FIG. 19 according to one embodiment of the present approach. The "input" is the value of the signal produced by element 1902. As expected, the output signal derived from the upper resistor network ("Signal ABCD") is the input minus 1 and then divided by two, while the output signal derived from the lower resistor network ("SignalEFGH") is the input plus 1 and then divided by two. The output of element 1902 is between −1 and 1; the corresponding value of Signal ABCD is between 0 and 1, while SignalEFGH is between −1 and 0.

As above, FIG. 4 illustrates a circuit 400 that produces ratios of properties that are encoded as a signal. To know whether to add or subtract 1, it is important to know whether the sign of the signal is greater or less than 0. The sign of that signal is given by the exclusive-or of the sign of the numerator and the sign of the denominator, which is equivalent to determining whether the signs of the numerator and denominator are the same or different.

Figure 21:
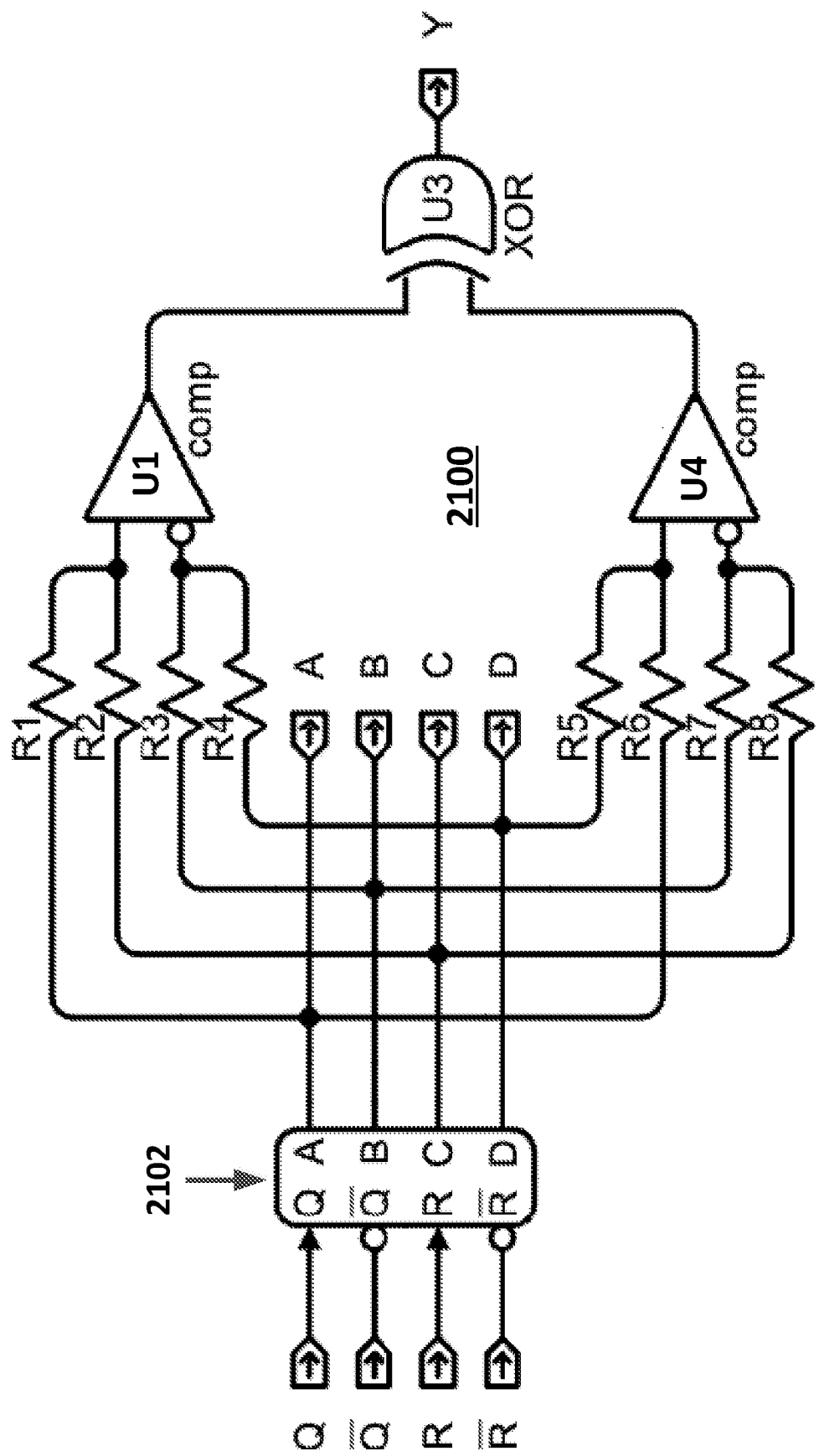
FIG. 21 is a diagram of a circuit that determines the sign of a signal according to one embodiment of the present approach.

FIG. 21 is a diagram of a circuit 2100 that determines the sign of a signal according to one embodiment of the present approach. Comparators U1 and U4 receive the values of A, B, C and D from element 2102 as either positive or negative inputs; from this comparator U1 determines the sign of the numerator of Equation 1 (the A and C values are positive inputs to comparator U1, while the B and D values are negative inputs), while comparator U2 determines the sign of the denominator (the A and D values are positive inputs to comparator U2, while the B and C values are negative inputs). The exclusive-or of the signs of the numerator and denominator is then determined by XOR device U3. Element 2102 again may be any of the circuits discussed above that generate outputs A, B, C and D.

If the output of XOR device U3 is positive, then the sign of the signal is positive, and the reference value should be subtracted, while if the reference value is negative, i.e., the output of U3 is negative, then the reference value should be added. But this presumes that the reference value is positive. However, the reference value itself has a sign, which is effectively the denominator of the signal. Comparator U4 determines whether the sign of the denominator, and thus the sign of the reference value, is positive or negative, and if the reference value is negative, subtracting the reference value is effectively adding its absolute value. Accordingly, it is sufficient to simply take the output of comparator U1, which provides the sign of the numerator of the signal, and subtract the reference value if the sign of the numerator is positive, and add the reference value if the sign of the denominator is negative. As will be seen below, this means that the functionality of circuit 2100 can be simplified.

Figure 22:
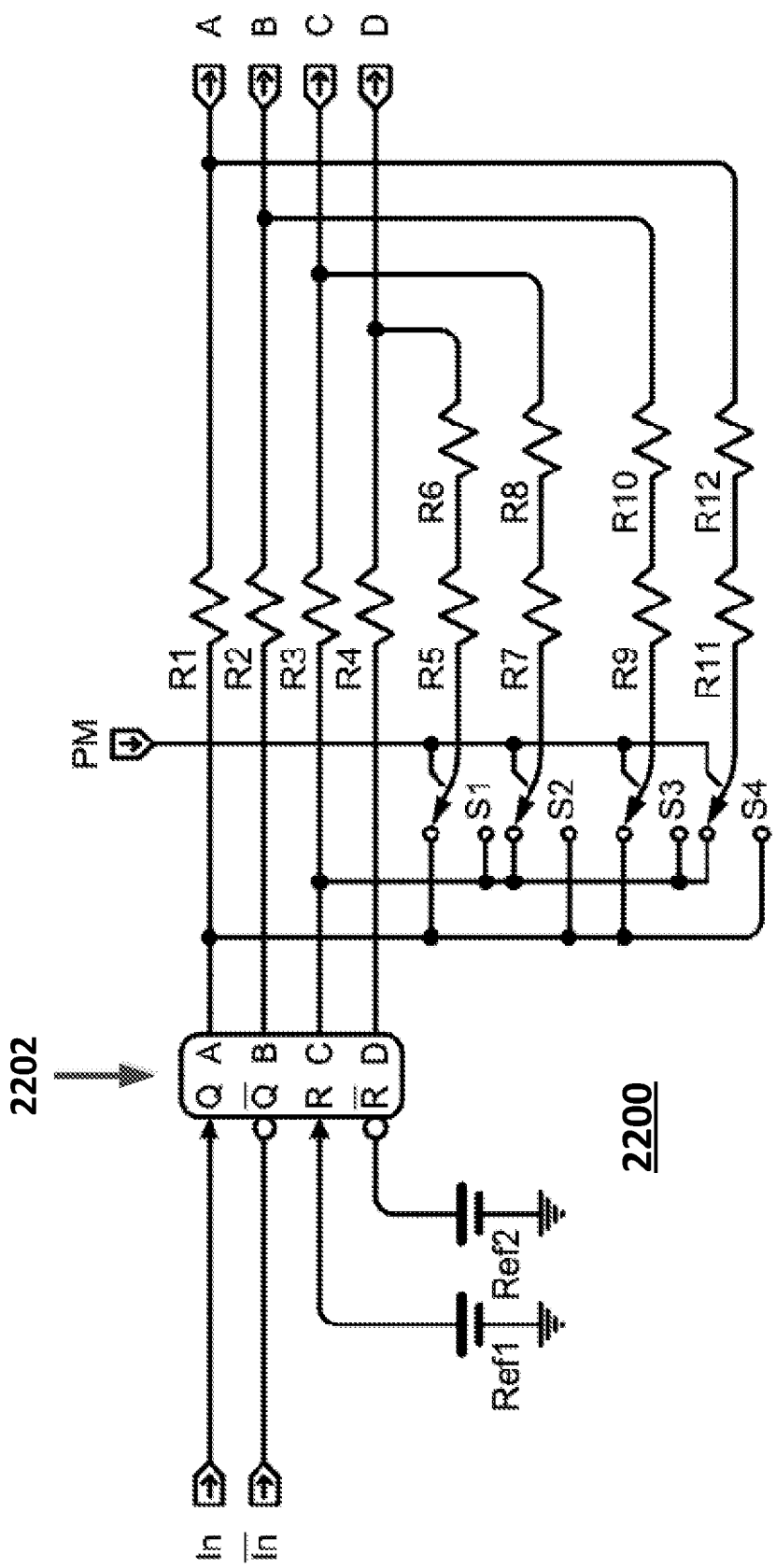
FIG. 22 is a diagram of a circuit that allows run-time selection of whether to add to or subtract from a signal according to one embodiment of the present approach.

FIG. 22 is a diagram of a circuit 2200 that allows run-time selection of whether to add to or subtract from a signal according to one embodiment of the present approach. Circuit 2200 will either add a 1 to or subtract a 1 from the output of element 2102 based upon the signal PM, which causes switches S1 to S4 to alter how the outputs of element 2202 contribute to the final outputs of circuit 2200. This is the same functionality as provided in the alternative in circuit 1900 of FIG. 19; fewer resistors are used in circuit 2200 because it will be seen that the "upper" and "lower" resistor networks of circuit 1900 above have certain commonalities that allow some resistors in circuit 2200 to participate in either adding or subtracting the reference value. (Again, all of the resistor values are equal.)

Element 2202 (which again may be any of the circuits discussed above) functions as an input resistor network, deriving voltages A, B, C and D from the input voltages. The output of element 2202 is determined by Equation 1 above as in all the other examples discussed; it may be a positive or a negative quantity. The wire labeled PM (for Plus or Minus) is a conventional encoded signal (i.e., it has a voltage property representing a bit interpreted by the switches S1 through S4). If the PM logic level is low, the switches are in the position shown and the output encoded on ABCD is the output encoded on the outputs of element 2202 minus 1, and then divided by two. For example, if the output of element 2202 encodes as 0.5 and PM is LOW, then ABCD encodes −0.25 (i.e., (0.5−1)/2). If the PM logic level is high, the ABCD encodes the output of element 2202 plus 1, and divided by two. Thus, if element 2202 encodes 0.9 and the PM is high, then ABCD encodes 0.95 (i.e., (0.9+1)/2).

Figure 23:
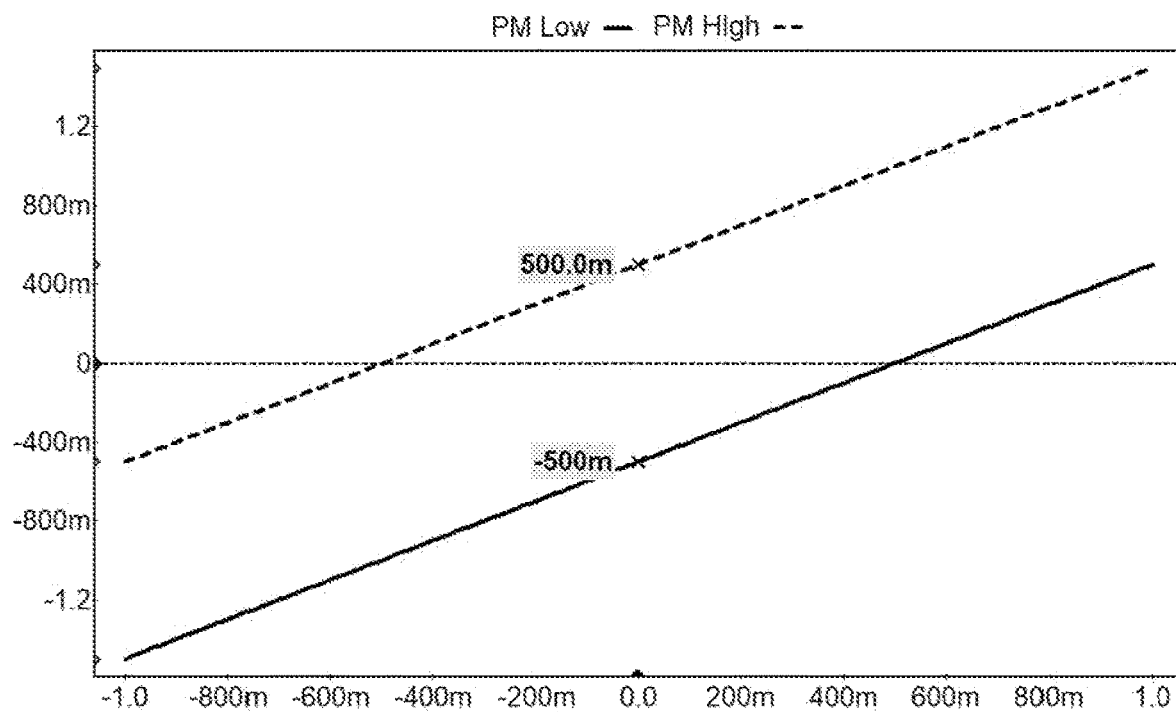
FIG. 23 is a graph showing the operation of the circuit of FIG. 22 according to one embodiment of the present approach.

FIG. 23 is a graph showing the operation of the circuit of FIG. 22 according to one embodiment of the present approach. The X-axis of FIG. 23 is the signal encoded at the output of element 2202. The Y-axis of FIG. 23 is the signal encoded on the ABCD wires of FIG. 22. Two lines are shown on the graph: the unbroken line shows the output on ABCD as the input (which is the output of 2202) is varied when PM is LOW. We see that the output is linear and is indeed. $Y=(X-1)/2$. The dashed line is the output on ABCD as the input (which is the output of 2202) is varied when PM is HIGH. Thus it can be seen that the output is linear and is indeed $Y=(X+1)/2$.

Figure 24:
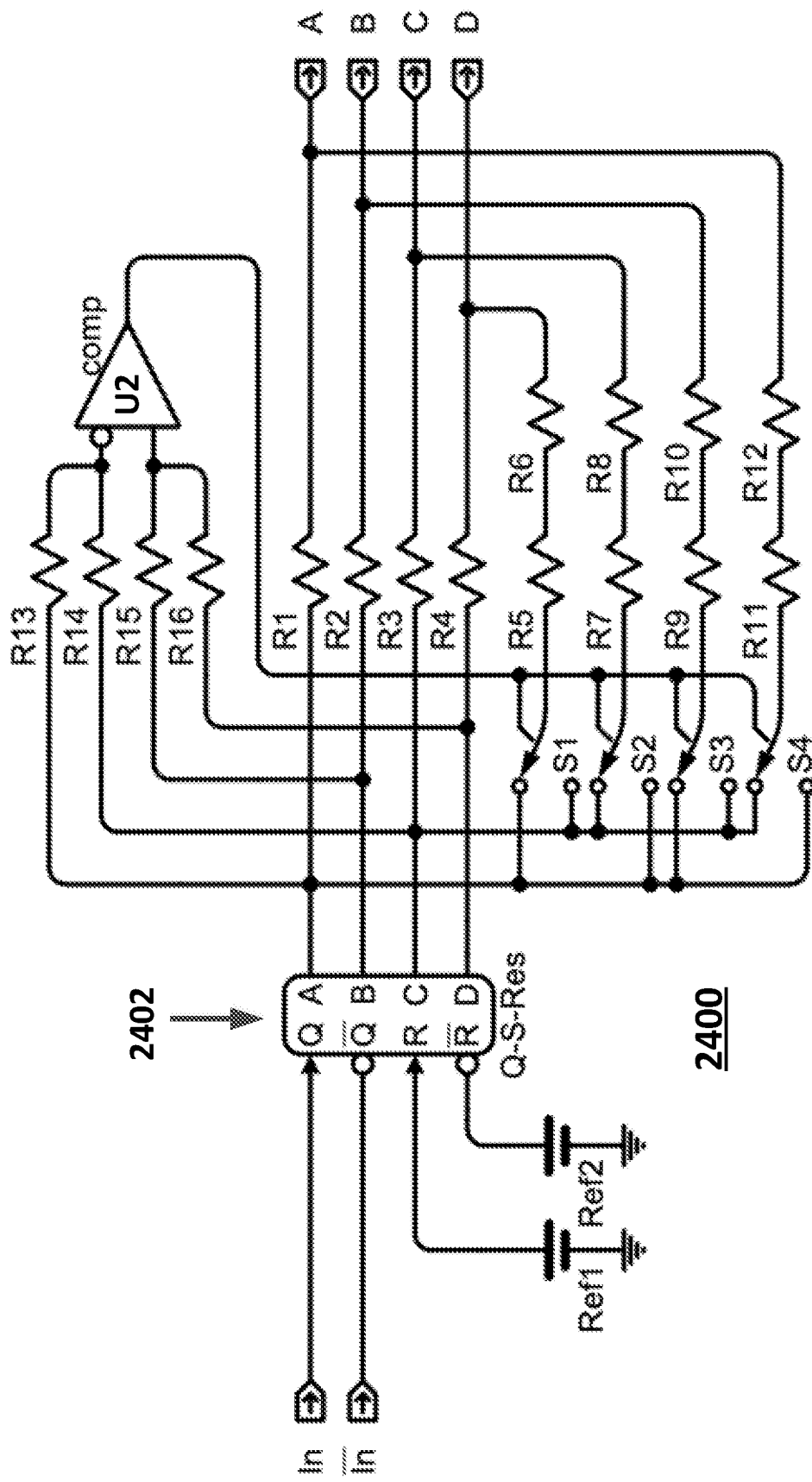
FIG. 24 is a diagram of another circuit that allows run-time selection of whether to add to or subtract from a signal according to one embodiment of the present approach.

FIG. 24 is a diagram of another circuit 2400 that allows run-time selection of whether to add to or subtract from a signal according to one embodiment of the present approach. Circuit 2400 contains circuit 2200 of FIG. 22 and adds the functionality for determining the signal PM in circuit 2200. Element 2402, as element 2202 in FIG. 22 above, acts as an input resistor network that receives the input voltage Q and generates a plurality of voltages A, B, C and D which are then output to the rest of circuit 2400.

A comparative resistor network containing resistors R13 to R16 provides the sum of the A and C voltages and the sum of the B and D voltages to a comparator U2. The comparator U2 in circuit 2400 is the equivalent of comparator U1 in circuit 2100 of FIG. 21; while this comparator is again an active device, it is needed as it determines the sign of the numerator, as did comparator U1 in circuit 2100.

To function as part of an ADC, it is necessary to look at the sign of the output of element 2402 and add or subtract the reference value. Circuit 2400, as circuit 2200, can do the addition and subtraction when an appropriate control signal moves switches S1 to S4 to control the connections of an output resistor network containing resistors R1 to R12. In circuit 2400, the comparator will cause the switches to change when the output of element 2402 passes through zero, causing the configuration of connections between resistors R1 to R12, and thus the A, B, C and D output voltages, to change.

Figure 25:
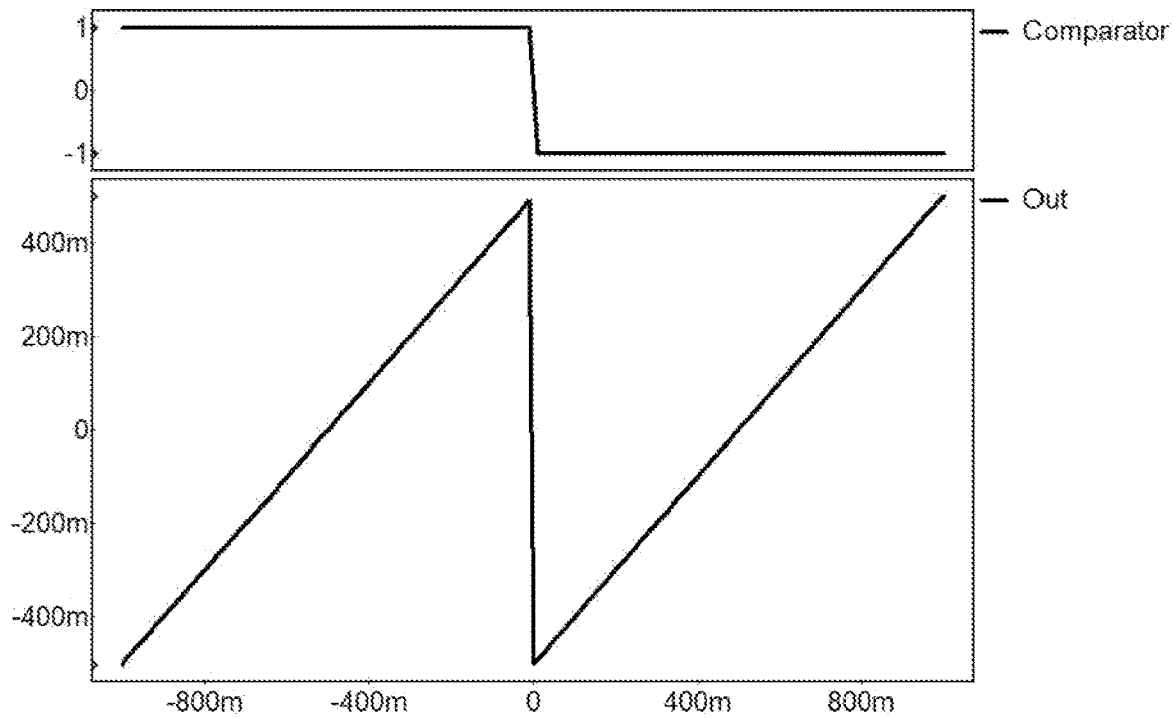
FIG. 25 is a graph showing the operation of the circuit of FIG. 24 according to one embodiment of the present approach.

FIG. 25 is a graph showing the operation of circuit 2400 of FIG. 24 according to one embodiment of the present approach. The upper graph of FIG. 25 shows the signal Comparator that comparator U2 receives from element 2402 of circuit 2400. The lower graph of FIG. 25 shows the output from circuit 2400.

Comparing FIG. 25 to FIG. 23, which shows the output of circuit 2200 of FIG. 22, it can be seen that the output of circuit 2400 follows the output signal PM High of FIG. 22 (the dashed line) in the first half; the output goes from −0.5 to 0.5 as the input goes from −1 to 0. When the signal Comparator switches from 1 to 0, the output of circuit 2400 switches to follow the output signal PM Low of FIG. 22 (the solid line); the output immediately switches from 0.5 back to −0.5, and then goes again from −0.5 to 0.5 as the input goes from 0 to 1.

This illustrates that it is possible in the signal domain, benefiting from the shift and scale invariance, to process a signal in a similar fashion to what is done in the known analog domain. The signal range is divided by one-half, and the signal can be passed to an identical circuit and processed again in the same fashion, thus extracting one bit at a time.

However, the output of circuit 2400 cannot simply be passed to another instance of the circuit; the input value runs from −1 to 1, while the output value runs from −0.5 to 0.5. The solution to this is to multiply the output value as described above.

By combining the circuits described above, it is possible to build an analog-to-digital converter (ADC) entirely in the analog domain with all quantities processed being encoded as signals in the manner described herein (other than the output "bits.") A typical ADC operates by determining first whether the signal is greater or less than the value of the most significant bit (MSB) and then passes the residue on to the next significant bit, etc., with ever decreasing signal levels (sometimes corrected for by amplification). Further, the timing of an ADC can be asymmetric, as something is done if the signal is greater than the current significant bit, but nothing is done if it is not.

In the present approach, the signal is always compared to zero, and bits are determined by whether the full scale value is added to or subtracted input value to each stage (here the full scale value is +1 or −1). The residue is doubled at each stage, so that the full range of the residue is the same as the original signal. The adding or subtracting of something at each step means the timing of the ADC is symmetric.

In the above description, FIG. 17 shows how to achieve gain of the signal. FIG. 19 shows adding or subtracting 1, and FIG. 21 shows how to compare the signal to zero to determine its sign. FIG. 22 removes redundancies from FIG. 19, since only the addition of 1 (or its subtraction) depends upon the comparison to zero in FIG. 21. FIG. 24 simplifies FIG. 21 by extracting the full scale reference value in the signal itself, so that it is not necessary to determine the signs of both inputs, and includes the simplified circuit of FIG. 22 to add 1 when appropriate.

Figure 26:
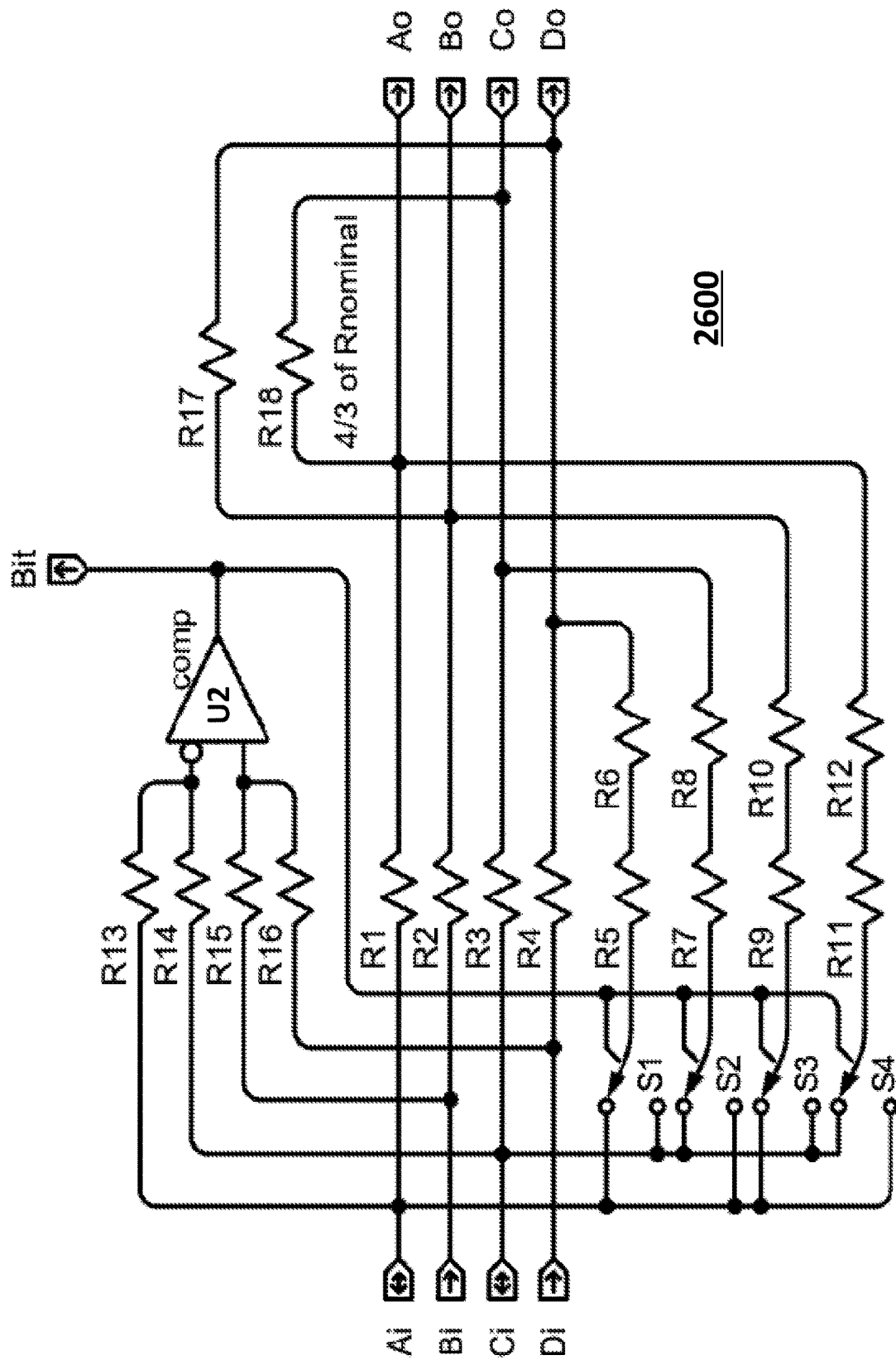
FIG. 26 is a diagram of a circuit that functions to extract one bit of a signal in an analog-to-digital converter according to one embodiment of the present approach.

FIG. 26 is a diagram of circuit 2600 that functions to extract one bit of a signal in an ADC according to one embodiment of the present approach. The element 2402 of circuit 2400, which again acts as an input resistor network that receives the input voltage Q and generates a plurality of voltages A, B, C and D which are then output to the rest of circuit 2400, is present in circuit 2600 but is not shown here.

Circuit 2600 includes circuit 2400 of FIG. 24, and adds resistors R17 and R18 to the output resistor network, which now contains resistors R1 to R12 and resistors R17 and R18, to multiply the output shown in FIG. 25 by two; this is necessary because the last combination of A, B, C and D values in FIG. 24 results in another halving of the outputs. To accomplish this, resistors R17 and R18 have a value of 4/3 times the nominal value of the other resistors in circuit 2600 (as a practical matter, this can be accomplished by a series/parallel combination of the same uniform-value resistors used elsewhere in the circuit).

The output of the comparative resistor network of resistors R13 to R16 and comparator U2 of circuit 2600 controls switches S1 to S4, as described above (and as comparator U2 in circuit 2400 above). In addition to controlling the switches, the same output of comparator U2 also serves as a bit that is derived from the inputs In, Inbar, Ref1 and Ref2.

It may now be seen that an ADC may be made in the analog domain by connecting a number of circuits like circuit 2600 in series; the number of such circuits will be the desired number of bits in the ADC minus 1.

Figure 27:
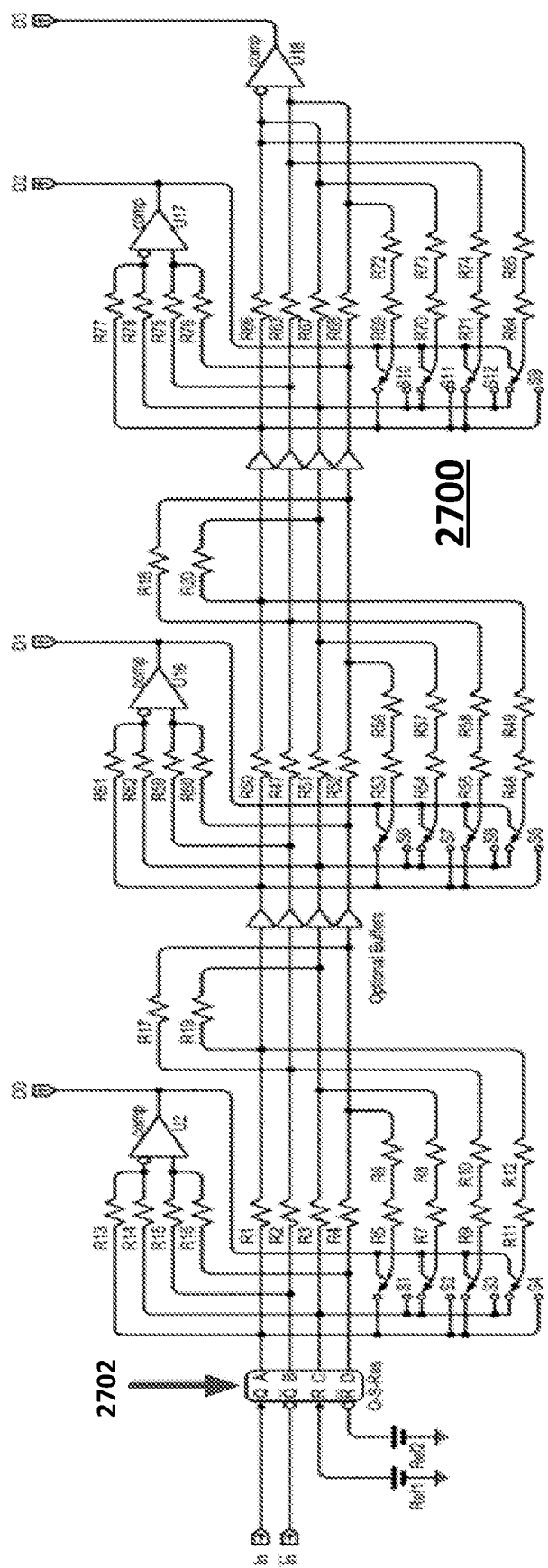
FIG. 27 is a diagram of a circuit that functions as a 4-bit analog-to-digital converter according to one embodiment of the present approach.

FIG. 27 is a diagram of a circuit 2700 that functions as a 4-bit analog-to-digital converter according to one embodiment of the present approach. Circuit 2700 contains a single input resistor network 2702 that receives the input voltage Q and generates a plurality of voltages A, B, C and D which are then output to the rest of circuit 2700.

Three instances of the comparative resistor network and output network portions of circuit 2600 are connected in a chain; the first instance of a comparative resistor network (2704) and output network (resistors R1 to R12, R17 and R19) extracts the most significant bit as described above, and multiplies the output, which corresponds to the residue, by two and passes it to the second instance of a comparative resistor network and output network. The second instance of a comparative resistor network and output network extracts a second bit, and again passes the output to the third instance of a comparative resistor network and output network. The third instance of a comparative resistor network and output network extracts a third bit. There is no need for a fourth instance of a comparative resistor network and output network, as the last bit may be obtained by simply passing the output from the prior instance of circuit 2600 through another comparator here labeled U18.

Circuit 2700 shows the sections of the ADC joined by optional buffers (the small triangles on the lines between each instance of circuit 2600) to allow for the fact that each stage expects a zero impedance output of the prior stage. However, these may be omitted in a circuit that uses a capacitive design paradigm, and the output impedance of the prior stage may be accommodated in the resistive design of each stage.

Figure 28:
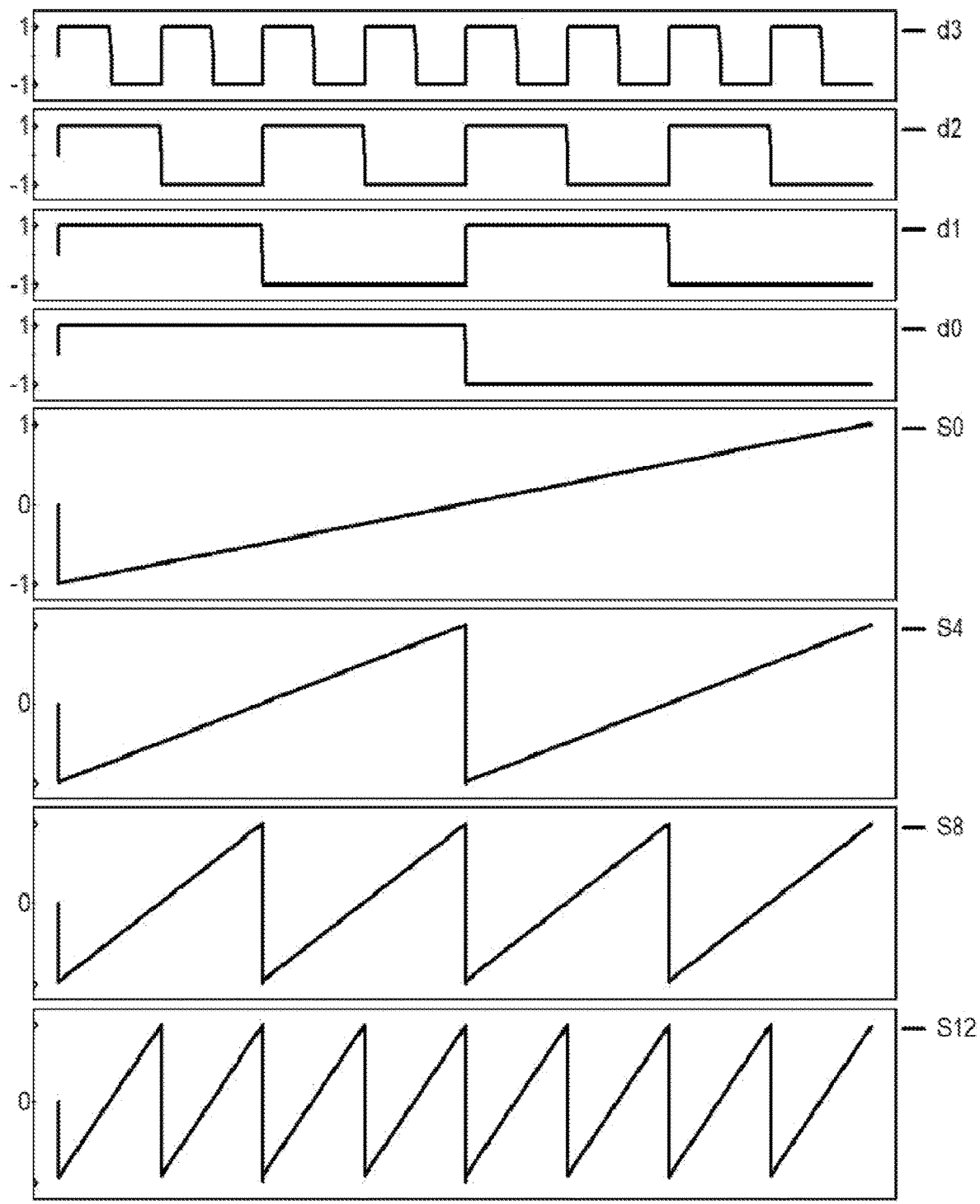
FIG. 28 is a set of graphs showing the operation of the circuit of FIG. 27 according to one embodiment of the present approach.

FIG. 28 is a set of graphs showing the operation of the circuit of FIG. 27 according to one embodiment of the present approach. The graphs at the top show the output bits obtained at each comparator D0, D1, D2 and D3 in circuit 2700, with D0 being the most significant bit and D3 the least significant bit, as seen from the positions of the comparators in FIG. 27.

The inputs In and Inbar and reference voltages Ref1 and Ref2 make a signal S0, from which the most significant bit is output from comparator D0 in the first instance of circuit 2600 in circuit 2700; a signal S4 is passed to the next instance of circuit 2600, which generates a second bit in comparator D1 from S4 and then passes a signal S8 to the third instance of circuit 2600. The third instance of circuit 2600 in turn generates a third bit from comparator D2, and passes a signal S12 to comparator D3, which generates the last bit.

An ADC of arbitrary length may be made using this approach, and with all the benefits described herein when compared to traditional signal processing. As above, such a circuit will use less power due to the limited number of active devices, and need not suffer from the delays inherent in most other analog or digital circuits.

The disclosed system has been explained above with reference to several embodiments. Other embodiments than the specific circuits described herein will be apparent to those skilled in the art in light of this disclosure.

Certain aspects of the described method and apparatus may readily be implemented using configurations other than those described in the embodiments above, or in conjunction with elements other than or in addition to those described above. For example, as is well understood by those of skill in the art, the analog property on which the formulation is invoked, here described always as a voltage, could also be a current which may be preferable in very low power and advanced CMOS circuits that operate on less than one volt. All the advantages of fast settling time and scale and shift invariance may be exploited in the current domain by reference to the analogous voltage mode disclosed herein. Further, as above, the illustration of resistors is exemplary; one of skill in the art will be able to select the appropriate number of resistors and related elements that is appropriate for a particular application, or build equivalent circuits from other linear two-port elements such as capacitors.

These and other variations upon the embodiments are intended to be covered by the present disclosure, which is limited only by the appended claims.

What is claimed is:

1. A time-gain amplifier, comprising:
   a first network of linear two-port elements configured to receive an input voltage Q and a reference voltage, generate a first plurality of voltages derived from the input voltage Q and the reference voltage, and combine the first plurality of generated voltages to create a first shift and scale invariant signal encoding the input voltage Q;
   a second network of linear two-port elements configured to receive the reference voltage, generate a second plurality of voltages derived from the reference voltage, and combine the second plurality of generated voltages to create a second shift and scale invariant signal encoding a value of 2;
   a third network of linear two-port elements configured to receive an input voltage Q2 and the reference voltage, generate a third plurality of voltages derived from the input voltage Q2 and the reference voltage, and combine the third plurality of generated voltages to create a third shift and scale invariant signal encoding the input voltage Q2;
   a fourth network of linear two-port elements configured to receive the reference voltage, generate a fourth plurality of voltages derived from the reference voltage, and combine the fourth plurality of generated voltages to create a fourth shift and scale invariant signal encoding a value of 2;
   a control circuit configured to provide the input voltage Q2, comprising:
      a switch having two ends, a first end connected to a voltage source and a second end connected to the third network, and having two positions, a closed position in which the voltage source is connected to the third network, and an open position in which the voltage source is not connected to the third network;
      a capacitor having a first end connected to the second end of the switch and a second end connected to a ground; and
      a resistor having a first end connected to the second end of the switch and a second end connected to the ground;
      whereby the capacitor charges when the switch is in the closed position, and discharges when the switch is in the open position at a rate determined by a resistance of the resistor and a capacitance of the capacitor, thereby providing a voltage to the third resistor network that diminishes with time;
   wherein the first and second networks are connected such that the first and second shift and scale invariant signals are combined to generate a fifth shift and scale invariant signal encoding a value of (2+Q)/2;
   wherein the third and fourth networks are connected such that the third and fourth shift and scale invariant signals are combined to generate a sixth shift and scale invariant signal encoding a value of (2−Q2)/2; and
   wherein the fifth and sixth shift and scale invariant signals are combined to generate a shift and scale invariant output signal encoding an amplified value of Q/Q2, whereby the amplifier applies a gain to the input voltage Q of 1/Q2.

2. The time gain amplifier of claim 1 wherein:
the first plurality of voltages comprises four voltages A1, B1, C1 and D1 such that the first shift and scale invariant signal is defined by $$\frac{A1 - B1 + C1 - D1}{A1 - B1 - C1 + D1};$$

the second plurality of voltages comprises four voltages A2, B2, C2 and D2 such that the second shift and scale invariant signal is defined by $$\frac{A2 - B2 + C2 - D2}{A2 - B2 - C2 + D2};$$

the third plurality of voltages comprises four voltages A3, B3, C3 and D3 such that the third shift and scale invariant signal is defined by $$\frac{A3 - B3 + C3 - D3}{A3 - B3 - C3 + D3};$$

and the fourth plurality of voltages comprises four voltages A4, B4, C4 and D4 such that the fourth shift and scale invariant signal is defined by $$\frac{A4 - B4 + C4 - D4}{A4 - B4 - C4 + D4}.$$

3. The time gain amplifier of claim 2 wherein the combined first and second shift and scale invariant signals to generate the fifth shift and scale invariant signal is done by:
combining the A1 voltage generated by the first network with the A2 voltage generated by the second network;
combining the B1 voltage generated by the first network with the B2 voltage generated by the second network;
combining the C1 voltage generated by the first network with the C2 voltage generated by the second network; and
combining the D1 voltage generated by the first network with the D2 voltage generated by the second network.

4. The time gain amplifier of claim 3 wherein the combined third and fourth shift and scale invariant signals to generate the sixth shift and scale invariant signal is done by:
combining the A3 voltage generated by the third network with the D4 voltage generated by the fourth network;
combining the B3 voltage generated by the third network with the C4 voltage generated by the fourth network;
combining the C3 voltage generated by the third network with the B4 voltage generated by the fourth network; and
combining the D3 voltage generated by the third network with the A4 voltage generated by the fourth network.

5. The time gain amplifier of claim 4 wherein the combined fifth and sixth shift and scale invariant signals to generate the shift and scale invariant output signal encoding an amplified value of Q/Q2 is done by:
combining the A1 voltage generated by the first network and the A2 voltage generated by the second network with the B3 voltage generated by the third network and the D4 voltage generated by the fourth network;
combining the B1 voltage generated by the first network and the B2 voltage generated by the second network with the A3 voltage generated by the third network and the D4 voltage generated by the fourth network;
combining the C1 voltage generated by the first network and the C2 voltage generated by the second network with the C3 voltage generated by the third network and the B4 voltage generated by the fourth network; and combining the D1 voltage generated by the first network and the D2 voltage generated by the second network with the D3 voltage generated by of the third network and the A4 voltage generated by the fourth network.

6. The time gain amplifier of claim 1 wherein the linear two-port elements are resistors.

7. The time gain amplifier of claim 1 wherein the linear two-port elements are capacitors.

8. A method of amplifying a signal using a time gain amplifier, comprising:
discharging a charged capacitor through a resistor thereby generating an input voltage Q2 from the capacitor that diminishes with time at a rate determined by a resistance of the resistor and a capacitance of the capacitor;
receiving an input voltage Q and a reference voltage in a first network of linear two-port elements;
generating by the first network a first plurality of voltages derived from the input voltage Q and the reference voltage;
combining the first plurality of generated voltages to create a first shift and scale invariant signal encoding the input voltage Q;
receiving the reference voltage in a second network of linear two-port elements;
generating by the second network a second plurality of voltages derived from the reference voltage;
combining the second plurality of generated voltages to create a second shift and scale invariant signal encoding a value of 2;
receiving the input voltage Q2 and the reference voltage in a third network of linear two-port elements;
generating by the third network a third plurality of voltages derived from the input voltage Q2 and the reference voltage;
combining the third plurality of generated voltages to create a third shift and scale invariant signal encoding the input voltage Q2;
receiving the reference voltage in a fourth network of linear two-port elements;
generating by the fourth network a fourth plurality of voltages derived from the reference voltage;
combining the fourth plurality of generated voltages to create a fourth shift and scale invariant signal encoding a value of 2;
combining the first and second shift and scale invariant signals to generate a fifth shift and scale invariant signal encoding a value of (2+Q)/2;
combining the third and fourth shift and scale invariant signals to generate a sixth shift and scale invariant signal encoding a value of (2−Q2)/2; and
combining the fifth and sixth shift and scale invariant signals to generate a shift and scale invariant output signal encoding an amplified value of Q/Q2, whereby the amplifier applies a gain to the input voltage Q of 1/Q2.

9. The method of claim 8 wherein:
the first plurality of voltages comprises four voltages A1, B1, C1 and D1 such that the first shift and scale invariant signal is defined by $$\frac{A1 - B1 + C1 - D1}{A1 - B1 - C1 + D1};$$

the second plurality of voltages comprises four voltages A2, B2, C2 and D2 such that the second shift and scale invariant signal is defined by $$\frac{A2 - B2 + C2 - D2}{A2 - B2 - C2 + D2};$$

the third plurality of voltages comprises four voltages A3, B3, C3 and D3 such that the third shift and scale invariant signal is defined by $$\frac{A3 - B3 + C3 - D3}{A3 - B3 - C3 + D3};$$

and the fourth plurality of voltages comprises four voltages A4, B4, C4 and D4 such that the fourth shift and scale invariant signal is defined by $$\frac{A4 - B4 + C4 - D4}{A4 - B4 - C4 + D4}.$$

10. The method of claim 9 wherein combining the first and second shift and scale invariant signals to generate the fifth shift and scale invariant signal further comprises:
 combining the A1 voltage generated by the first network with the A2 voltage generated by the second network;
 combining the B1 voltage generated by the first network with the B2 voltage generated by the second network;
 combining the C1 voltage generated by the first network with the C2 voltage generated by the second network; and
 combining the D1 voltage generated by the first network with the D2 voltage generated by the second network.

11. The method of claim 10 wherein combining the third and fourth shift and scale invariant signals to generate the sixth shift and scale invariant signal further comprises:
 combining the A3 voltage generated by the third network with the D4 voltage generated by the fourth network;
 combining the B3 voltage generated by the third network with the C4 voltage generated by the fourth network;
 combining the C3 voltage generated by the third network with the B4 voltage generated by the fourth network; and
 combining the D3 voltage generated by the third network with the A4 voltage generated by the fourth network.

12. The method of claim 11 wherein combining the fifth and sixth shift and scale invariant signals to generate the shift and scale invariant output signal encoding an amplified value of Q/Q2 further comprises:
 combining the A1 voltage generated by the first network and the A2 voltage generated by the second network with the B3 generated by the third network and the D4 voltage generated by the fourth network;
 combining the B1 voltage generated by the first network and the B2 voltage generated by the second network with the A3 voltage generated by the third network and the D4 voltage generated by the fourth network;
 combining the C1 voltage generated by the first network and the C2 voltage generated by the second network with the C3 voltage generated by the third network and the B4 voltage generated by the fourth network; and
 combining the D1 voltage generated by the first network and the D2 voltage generated by the second network with the D3 voltage generated by the third network and the A4 voltage generated by the fourth network.

13. The method of claim 8 wherein the linear two-port elements are resistors.

14. The method of claim 8 wherein the linear two-port elements are capacitors.

* * * * *